(12) United States Patent
Yoshida

(10) Patent No.: US 10,847,388 B2
(45) Date of Patent: Nov. 24, 2020

(54) SUBSTRATE PROCESSING APPARATUS

(71) Applicant: SCREEN Holdings Co., Ltd., Kyoto (JP)

(72) Inventor: Takeshi Yoshida, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 15/465,031

(22) Filed: Mar. 21, 2017

(65) Prior Publication Data

US 2017/0287741 A1 Oct. 5, 2017

(30) Foreign Application Priority Data

Mar. 30, 2016 (JP) .................................. 2016-069652

(51) Int. Cl.
| | |
|---|---|
| *H01L 21/67* | (2006.01) |
| *B08B 3/08* | (2006.01) |
| *B08B 15/04* | (2006.01) |
| *F26B 5/08* | (2006.01) |
| *H01L 21/687* | (2006.01) |

(52) U.S. Cl.
CPC .......... *H01L 21/67051* (2013.01); *B08B 3/08* (2013.01); *B08B 15/04* (2013.01); *F26B 5/08* (2013.01); *H01L 21/6715* (2013.01); *H01L 21/68764* (2013.01)

(58) Field of Classification Search
CPC ...................... H01L 21/67051; H01L 21/6708
See application file for complete search history.

(56) References Cited

U.S. PATENT DOCUMENTS

| | | | |
|---|---|---|---|
| 6,643,882 B1 * | 11/2003 | Sotozaki ................ | B08B 1/007 15/102 |
| 2004/0050491 A1 | 3/2004 | Miya et al. ............. | 156/345.11 |
| 2009/0084409 A1 * | 4/2009 | Okura .................... | B08B 15/02 134/21 |
| 2010/0310757 A1 * | 12/2010 | Ooshiro ............... | B05C 5/0291 427/8 |
| 2011/0240601 A1 | 10/2011 | Hashizume et al. ............ | 216/83 |
| 2012/0273011 A1 | 11/2012 | Osada et al. ................... | 134/33 |
| 2013/0020284 A1 | 1/2013 | Osada et al. ................... | 216/57 |

(Continued)

FOREIGN PATENT DOCUMENTS

| | | |
|---|---|---|
| CN | 101905205 A | 12/2010 |
| JP | 2007-035866 A | 2/2007 |

(Continued)

OTHER PUBLICATIONS

JP2015192050—Machine Translation (Year: 2015).*

*Primary Examiner* — Marc Lorenzi
(74) *Attorney, Agent, or Firm* — Ostrolenk Faber LLP

(57) ABSTRACT

A guard that receives a processing liquid removed off a substrate, is disposed so as to surround a substrate holding unit and a facing member in plan view. The guard forms, together with the substrate and the facing member having a facing surface facing an upper surface of the substrate, a space isolated from an ambient atmosphere. An inert gas supplying unit supplies an inert gas to the space to replace an atmosphere inside the space by the inert gas. A processing liquid supplying nozzle, which extends from an inner wall of the guard so as to be disposed inside the space in a state where the space is formed, supplies the processing liquid to the upper surface of the substrate.

11 Claims, 20 Drawing Sheets

(56) References Cited

U.S. PATENT DOCUMENTS

| | | |
|---|---|---|
| 2014/0026926 A1 | 1/2014 | Semmelrock et al. ......... 134/30 |
| 2016/0042980 A1 | 2/2016 | Ohashi |
| 2017/0117135 A1 | 4/2017 | Yoshida et al. |
| 2017/0186599 A1 | 6/2017 | Takahashi et al. ........... 438/704 |
| 2018/0337067 A1* | 11/2018 | Kosai ..................... B08B 3/041 |

FOREIGN PATENT DOCUMENTS

| | | |
|---|---|---|
| JP | 2009-231733 A | 10/2009 |
| JP | 2011-216608 | 10/2011 |
| JP | 2012-231049 | 11/2012 |
| JP | 2013-026369 | 2/2013 |
| JP | 2013-026379 | 2/2013 |
| JP | 2014-179491 | 9/2014 |
| JP | 2015-192050 A | 11/2015 |
| JP | 2017-117954 A | 6/2017 |

\* cited by examiner

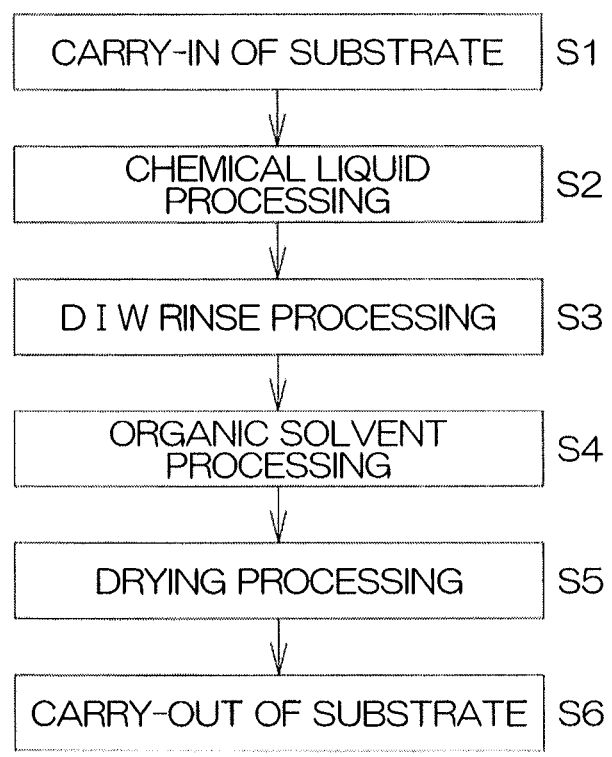

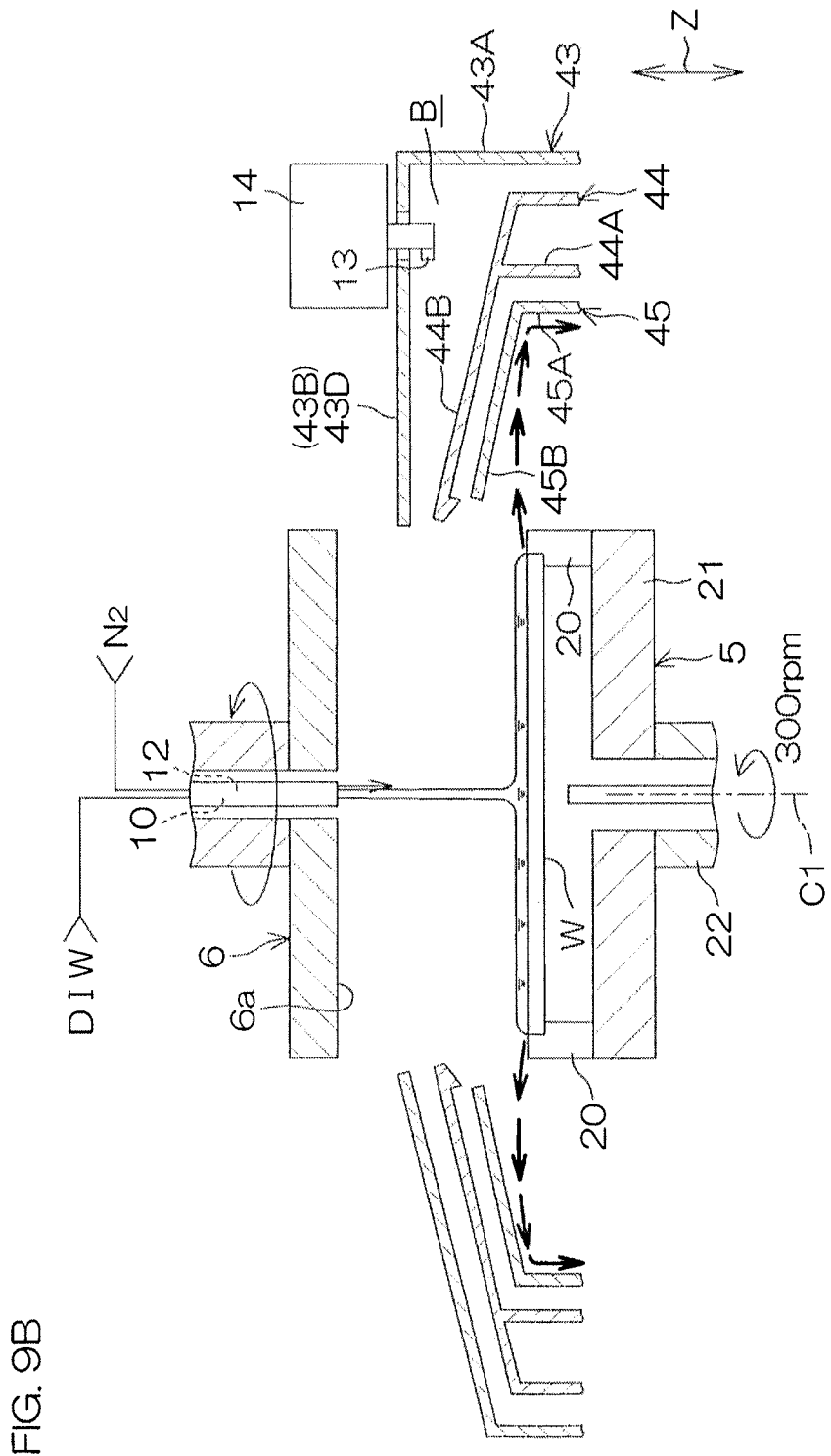

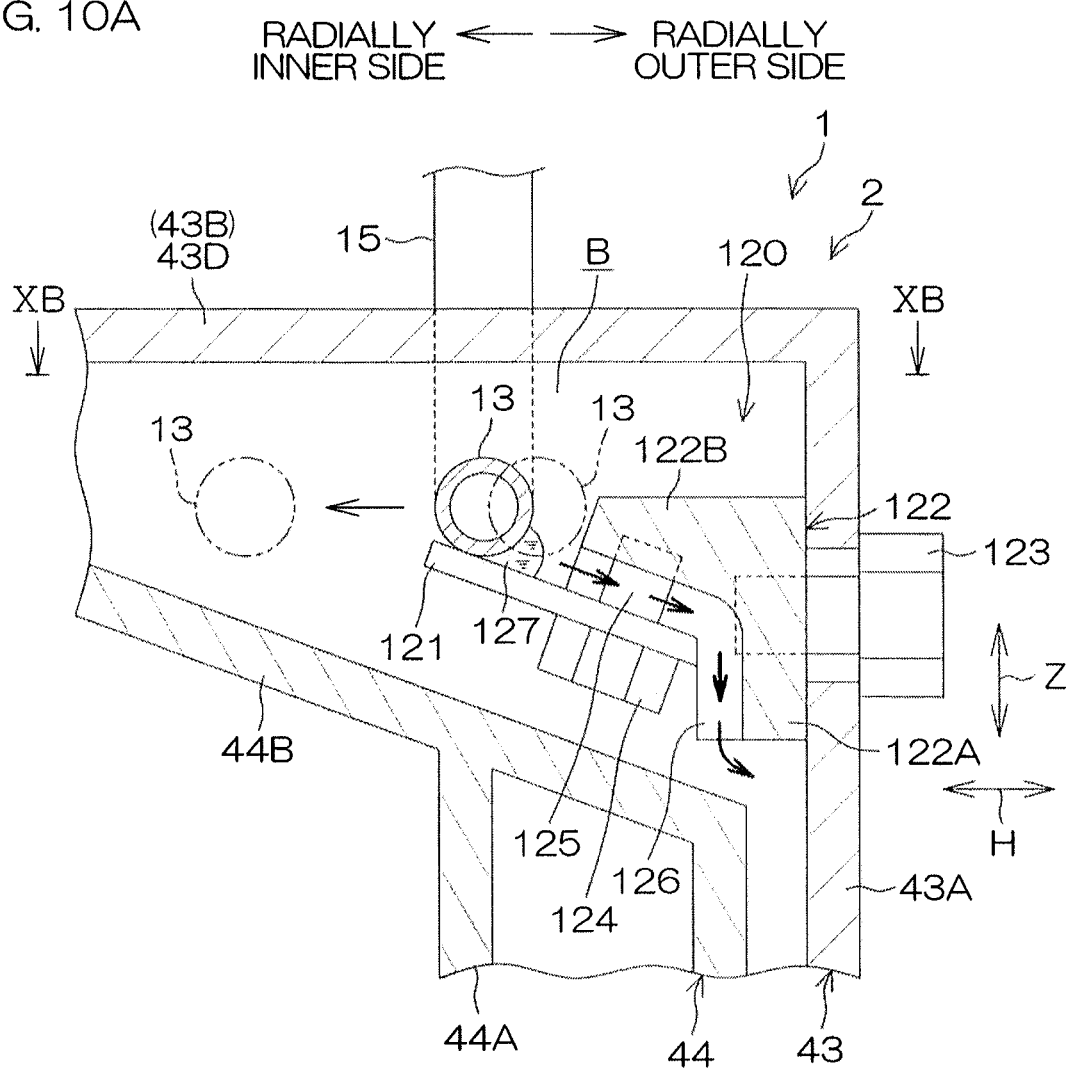

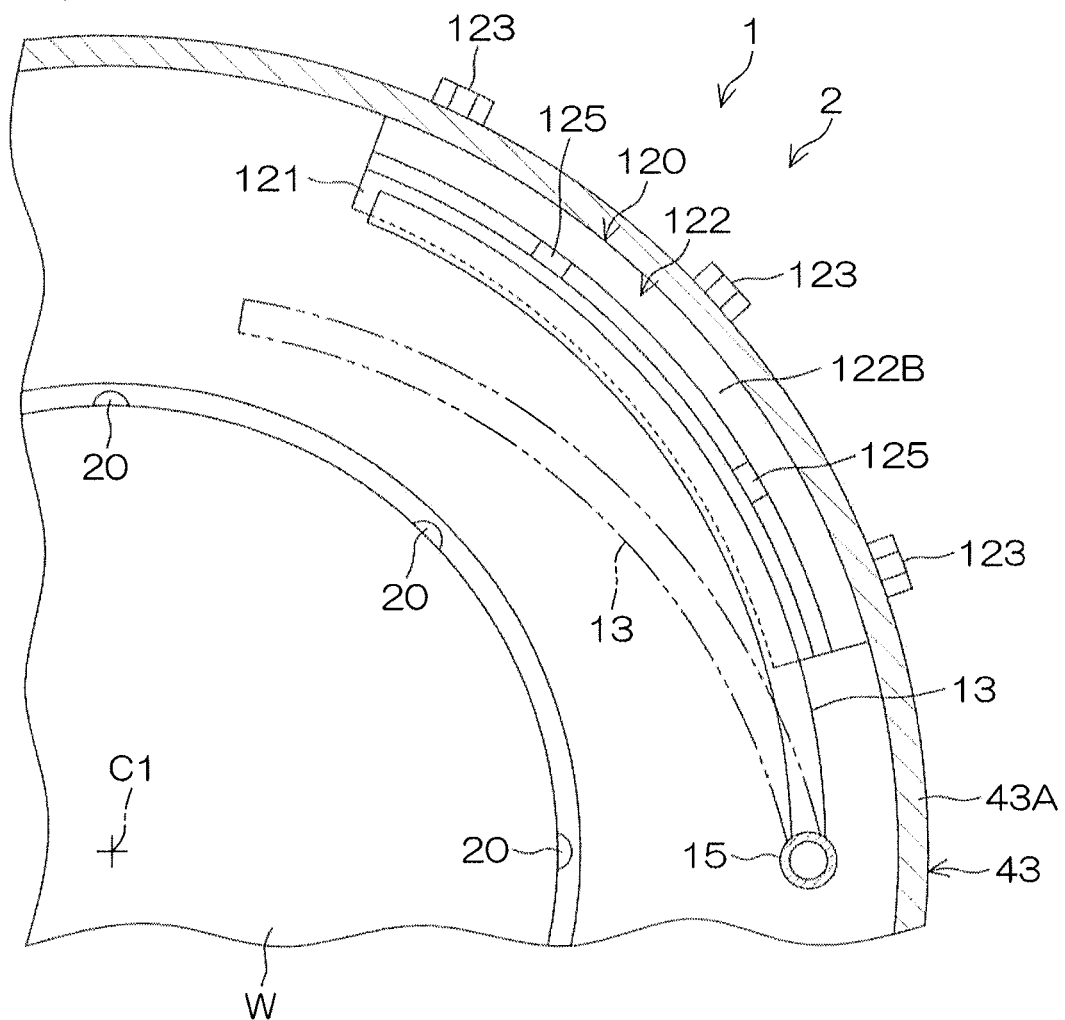

SUBSTRATE PROCESSING APPARATUS

BACKGROUND OF THE INVENTION

1. Field of the Invention

The present invention relates to a substrate processing apparatus that processes a substrate. Examples of substrates to be processed include semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of the Related Art

In substrate processing by a single substrate processing type substrate processing apparatus that processes a substrate one by one, for example, a chemical liquid is supplied to the substrate that is held substantially horizontally by a spin chuck. Thereafter, a rinse liquid is supplied to the substrate and the chemical liquid on the substrate is thereby replaced by the rinse liquid. Thereafter, a spin drying step is performed to remove the rinse liquid on the substrate.

When as shown in FIG. 15, a fine pattern is formed on a front surface of the substrate, it may not be possible to eliminate the rinse liquid, which has entered into an interior of the pattern, by the spin drying step and this may cause drying failure to occur. A liquid surface (an interface of air and liquid) of the rinse liquid that has entered into the interior of the pattern is formed in the interior of the pattern and therefore surface tension of the liquid acts at positions of contact of the liquid surface and the pattern. When the surface tension is high, pattern collapse occurs readily. Water, which is a typical rinse liquid, is high in surface tension and therefore pattern collapse in the spin drying step cannot be neglected.

It may therefore be considered to supply isopropyl alcohol (IPA), which is a low surface tension liquid of lower surface tension than water, to the substrate to replace the water, which has entered into the interior of the pattern, by the IPA and thereafter eliminate the IPA to dry an upper surface of the substrate.

To eliminate the IPA and promptly dry the upper surface of the substrate, an atmosphere in a vicinity of the upper surface of the substrate must be reduced in humidity. Also, the pattern may become oxidized by oxygen dissolved in the IPA and therefore the atmosphere in the vicinity of the upper surface of the substrate must be reduced in oxygen concentration so that an amount of oxygen dissolved in the IPA will be reduced. However, it is difficult to reduce the oxygen concentration and the humidity of an entirety of an atmosphere inside a processing chamber because the spin chuck and other members are housed in an internal space of the processing chamber.

A gas supplying apparatus that covers an entirety of an upper surface of a substrate is disclosed in United States Patent Application Publication No. 2014/0026926 A1 specification. A fluid dispenser that supplies a fluid, such as IPA, to the upper surface of the substrate is housed in a gas hood of the gas supplying apparatus. A gas inlet, to which an inert gas, such as nitrogen gas, is supplied, is formed at a center of the gas hood. A nozzle is mounted to one end of the fluid dispenser and an output shaft of a motor that drives the fluid dispenser is mounted to another end of the fluid dispenser. The output shaft penetrates through the gas hood.

SUMMARY OF THE INVENTION

With the gas supplying apparatus described in FIG. 10 and FIG. 11 of United States Patent Application Publication No. 2014/0026926 A1 specification, an atmosphere inside the gas hood is reduced in oxygen concentration and humidity by filling the gas hood interior with the inert gas. However, the output shaft of the motor is mounted to the gas hood and therefore the gas hood is obstructed by the output shaft of the motor and cannot approach the upper surface of the substrate sufficiently. With such an arrangement, it may not be possible to promptly reduce the oxygen concentration and the humidity of the atmosphere inside the gas hood.

Thus, an object of the present invention is to provide a substrate processing apparatus capable of promptly reducing the oxygen concentration and the humidity of an atmosphere between a substrate held by a substrate holding unit and a facing member.

The present invention provides a substrate processing apparatus that processes a substrate by a processing liquid and is a substrate processing apparatus that includes a substrate holding unit that holds a substrate horizontally, a facing member, having a facing surface that faces an upper surface of the substrate held by the substrate holding unit, a guard that is disposed so as to surround the substrate holding unit and the facing member in plan view, is capable of forming, together with the substrate held by the substrate holding unit and the facing member, a space isolated from an ambient atmosphere, and receives processing liquid removed off the substrate, a processing liquid supplying nozzle that extends from an inner wall of the guard so as to be disposed inside the space in a state where the space is formed and supplies the processing liquid to the upper surface of the substrate held by the substrate holding unit, and an inert gas supplying unit that supplies an inert gas to the space to replace an atmosphere inside the space by the inert gas.

With the present arrangement, the processing liquid supplying nozzle extends from the inner wall of the guard that is disposed so as to surround the substrate holding unit and the facing member in plan view. Therefore, in comparison to an arrangement where the processing liquid supplying nozzle or other member is mounted to the facing member, the facing member can be disposed in a state where the facing surface is brought sufficiently close to the upper surface of the substrate. The space that the guard forms together with the facing member and the substrate held by the substrate holding unit can thus be made small. By supplying the inert gas from the inert gas supplying unit in this state to replace the atmosphere inside the space by the inert gas, the oxygen concentration and the humidity of an atmosphere between the facing member and the substrate held by the substrate holding unit can be reduced promptly.

Also, the processing liquid supplying nozzle is disposed inside the space. The processing liquid supplying nozzle can thus supply the processing liquid to the upper surface of the substrate in a state where the atmosphere inside the space is replaced by the inert gas, that is, in a state where the oxygen concentration and the humidity in the atmosphere are reduced.

In the preferred embodiment of the present invention, the substrate processing apparatus further includes a nozzle moving unit that is connected to the guard and moves the processing liquid supplying nozzle between the upper surface of the substrate held by the substrate holding unit and the facing surface.

With the present arrangement, the nozzle moving unit that moves the processing liquid supplying nozzle between the upper surface of the substrate held by the substrate holding unit and the facing surface is connected to the guard. The oxygen concentration and the humidity of the atmosphere between the substrate and the facing member can thereby be reduced while moving the processing liquid supplying nozzle inside the space that the guard forms together with the facing member and the substrate held by the substrate holding unit.

In the preferred embodiment of the present invention, the nozzle moving unit includes a nozzle supporting member that supports the processing liquid supplying nozzle, and a driving unit that is fixed to the guard and drives the nozzle supporting member of the facing member.

With the present arrangement, by means of the nozzle moving unit with a simple arrangement that includes the nozzle supporting member and the driving unit, the processing liquid supplying nozzle can be moved inside the space, which the guard forms together with the facing member and the substrate held by the substrate holding unit.

In the preferred embodiment of the present invention, the nozzle supporting member is inserted through a penetrating hole formed in the guard. Also, the driving unit is disposed outside the space in the state where the space is formed.

With the present arrangement, the nozzle supporting member is inserted through the penetrating hole formed in the guard. Also, in the state where the guard, together with the facing member and the substrate held by the substrate holding unit, forms the space, the driving unit is disposed outside the space. Movement of the processing liquid supplying nozzle inside the space is thus enabled regardless of the size of the driving unit and the space can be made small.

In the preferred embodiment of the present invention, the substrate processing apparatus further includes a guard elevating/lowering unit that elevates and lowers the guard and a moving unit fixing member that is mounted to the guard elevating/lowering unit and fixes the nozzle moving unit to the guard. Also, a portion of the nozzle moving unit that is fixed by the moving unit fixing member overlaps with the guard elevating/lowering unit in plan view.

With the present arrangement, the moving unit fixing member is mounted to the guard elevating/lowering unit. The portion of the nozzle moving unit that is fixed by the moving unit fixing member overlaps with the guard elevating/lowering unit in plan view. The guard elevating/lowering unit is thereby made capable of bearing the nozzle moving unit via the moving unit fixing member. The weight that the guard receives from the nozzle moving unit can thus be reduced and therefore damage and deformation of the guard due to aging degradation can be suppressed. The guard can thus form the space with stability even after use over a long term and therefore the oxygen concentration and the humidity of the atmosphere between the facing member and the substrate held by the substrate holding unit can be reduced even after use over a long term.

In the preferred embodiment of the present invention, the substrate processing apparatus further includes a fixed member that is disposed above the guard and fixed in position in a vertical direction with respect to the substrate holding unit, and a bellows that is disposed between the guard and the fixed member, isolates the nozzle moving unit from the ambient atmosphere, and is extensible and contractible vertically.

With the present arrangement, the bellows disposed between the guard and the fixed member contracts and extends in the vertical direction when the guard is elevated and lowered. The nozzle moving unit can thus be isolated from the ambient atmosphere regardless of the position of the guard in the vertical direction.

In the preferred embodiment of the present invention, the substrate processing apparatus further includes a lower side guard, that defines the space from below the guard and receives the processing liquid removed off the substrate. Also, a housing space that is capable of housing the processing liquid supplying nozzle, is provided between the guard and the lower side guard.

With the present arrangement, the processing liquid supplying nozzle is housed in the housing space. The lower side guard can thus be disposed close to the guard. The space formed by the guard can thus be made small in an arrangement where the space is defined from below by the lower side guard.

In the preferred embodiment of the present invention, the guard includes a cylindrical portion that surrounds the substrate holding unit, and a flat portion that extends from the cylindrical portion and being flat in a horizontal direction, and the lower side guard includes a facing portion that extends incliningly with respect to the horizontal direction and faces the flat portion from below. Also, the housing space is defined by the cylindrical portion, the flat portion, and the facing portion.

With the present arrangement, the facing portion of the lower side guard extends incliningly with respect to the horizontal direction. The facing portion faces the flat portion, which extends from the cylindrical portion of the guard and is flat in the horizontal direction, from below. Therefore, even if the guard and the lower side guard are positioned so that the facing portion is brought close to the flat portion, the housing space of sufficient size for housing the processing liquid supplying nozzle can be secured.

In the preferred embodiment of the present invention, the substrate processing apparatus further includes a liquid eliminating unit that eliminates a liquid attached to a surface of the processing liquid supplying nozzle.

With the present arrangement, the liquid eliminating unit can eliminate the liquid attached to the surface of the processing liquid supplying nozzle. Contamination of the substrate due to dropping of the liquid, attached to the surface of the processing liquid supplying nozzle, onto the upper surface of the substrate can thus be prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is a flow diagram for describing an example of substrate processing performed by the substrate processing apparatus.

FIG. 9A to FIG. 9G are schematic sectional views for describing conditions of the substrate processing.

FIG. 10A is an enlarged schematic sectional view of a vicinity of a processing liquid supplying nozzle according to a first modification example of the present preferred embodiment.

FIG. 10B is a schematic sectional view taken along line XB-XB in FIG. 10A.

DETAILED DESCRIPTION OF THE PREFERRED EMBODIMENTS

Figure 1:
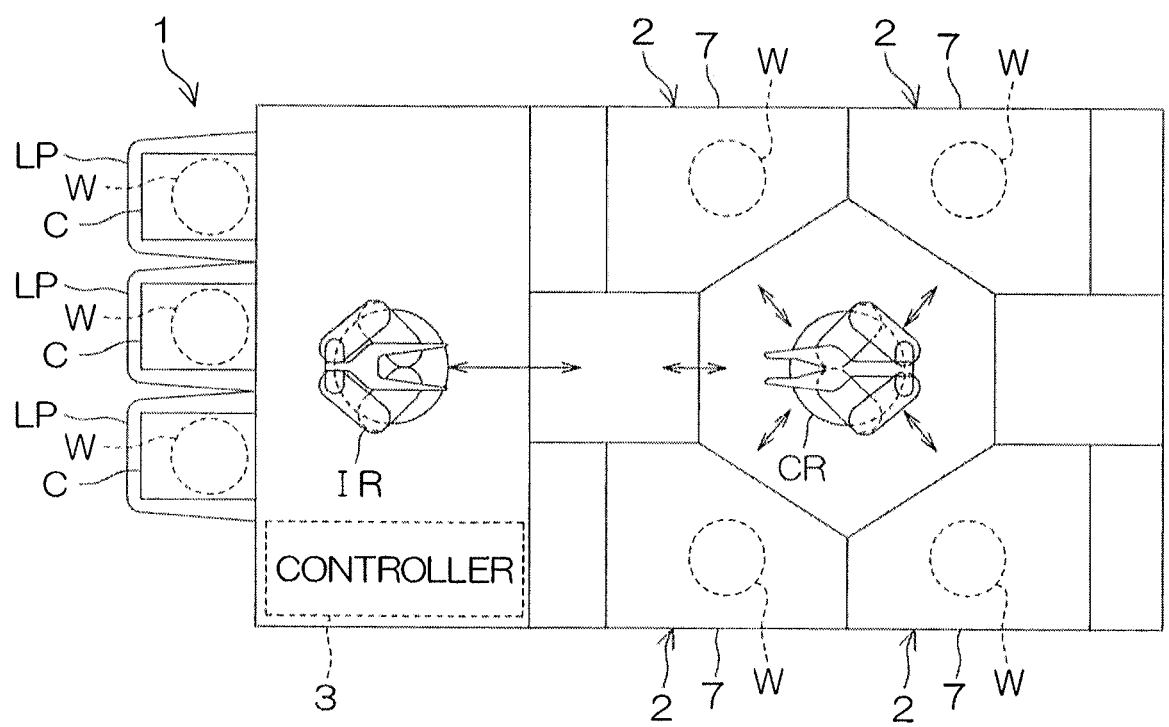
FIG. 1 is a schematic plan view for describing a layout of an interior of a substrate processing apparatus according to a first preferred embodiment of the present invention.
Figure 15:
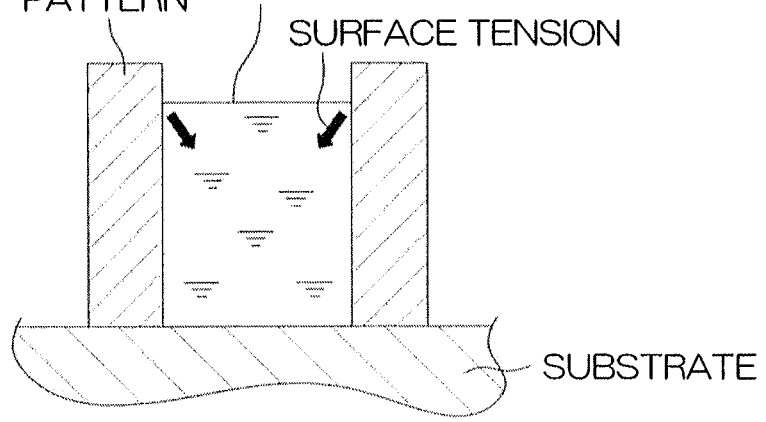
FIG. 15 is a schematic sectional view for describing principles of pattern collapse due to surface tension.

FIG. 1 is a schematic plan view for describing a layout of an interior of a substrate processing apparatus 1 according to a preferred embodiment of the present invention. The substrate processing apparatus 1 is a single substrate processing type apparatus that processes a substrate W, such as a silicon wafer, one by one by a processing liquid. A chemical liquid, a rinse liquid, an organic solvent, etc., can be cited as the processing liquid. In the present preferred embodiment, the substrate W is a circular substrate. A fine pattern (see FIG. 15) is formed on a front surface of the substrate W.

The substrate processing apparatus 1 includes a plurality of processing units 2 that process a substrate W by the processing liquid respectively, a plurality of load ports LP that hold a carrier C that houses a plurality of substrates W to be processed by the processing units 2 respectively, transfer robots IR and CR that transport the substrates W between the load ports LP and the processing units 2, and a controller 3 that controls the substrate processing apparatus 1. The transfer robot IR transfers the substrates W between the carriers C and the transfer robot CR. The transfer robot CR transfers the substrates W between the transfer robot IR and the processing units 2. The plurality of processing units 2 have, for example, the same arrangement.

Figure 2:
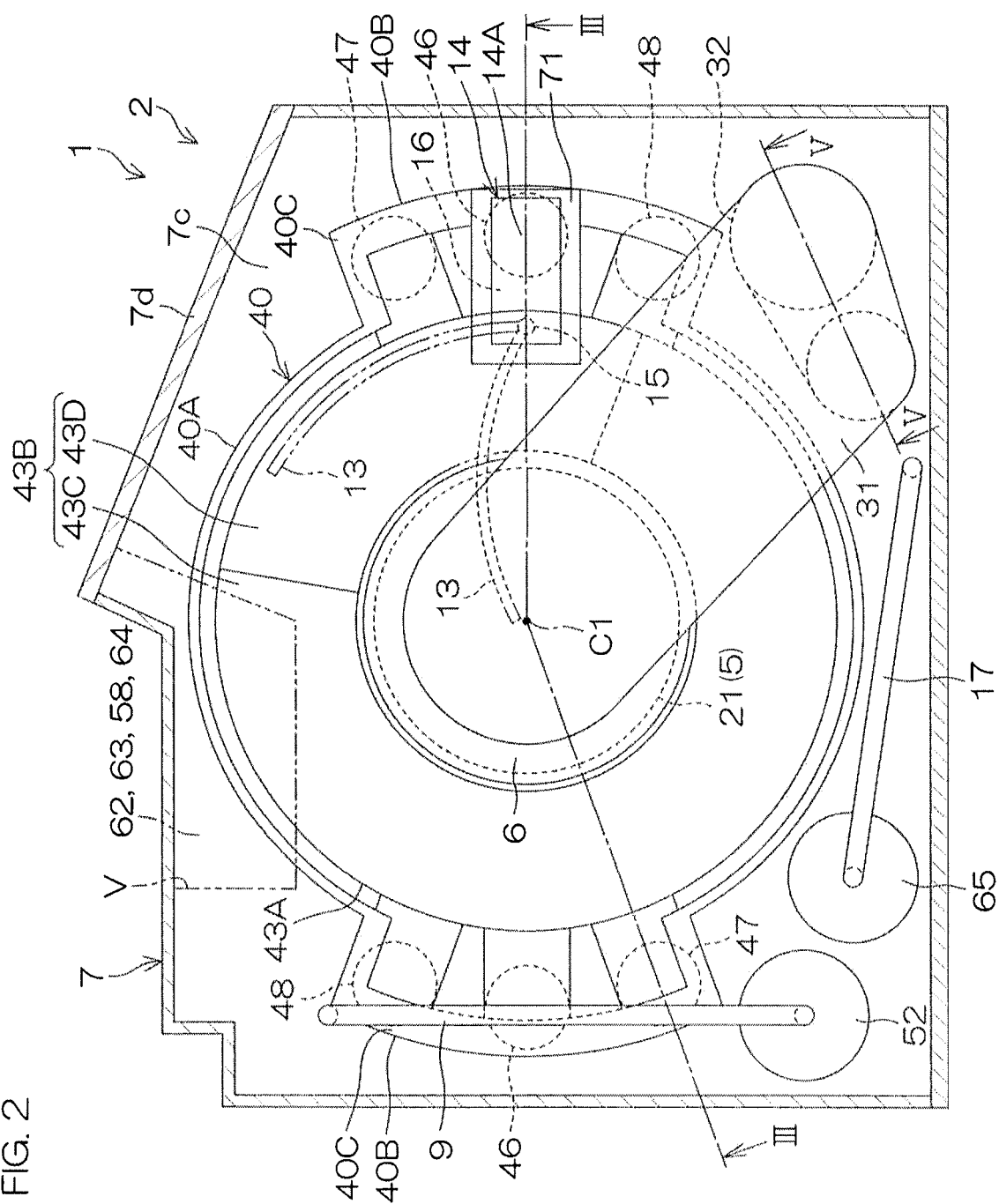
FIG. 2 is an illustrative transverse sectional view for describing an arrangement example of a processing unit included in the substrate processing apparatus.
Figure 3:
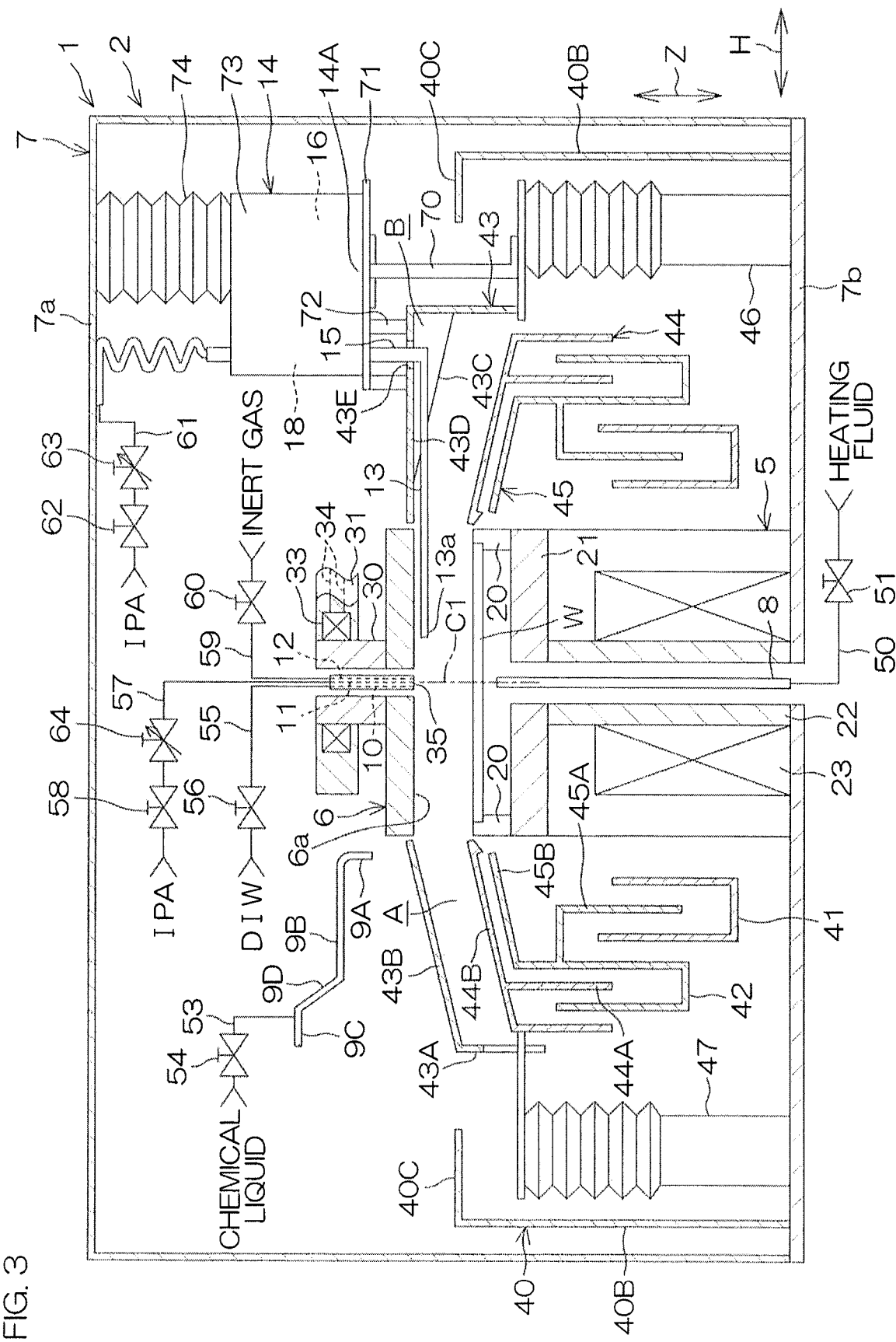
FIG. 3 corresponds to a vertical sectional view taken along line in FIG. 2 and is a schematic view for describing the arrangement example of the processing unit.

FIG. 2 is a schematic transverse sectional view for describing an arrangement example of a processing unit 2. FIG. 3 corresponds to a vertical sectional view taken along line in FIG. 2 and is a schematic view for describing the arrangement example of the processing unit 2.

The processing unit 2 includes a spin chuck 5 that rotates a single substrate W around a vertical rotational axis C1 passing through a center of the substrate W while holding the substrate W in a horizontal orientation. The spin chuck 5 is an example of a substrate holding unit that holds the substrate W horizontally. The substrate holding unit is also called a substrate holder. The processing unit 2 further includes a shielding plate 6 as a facing member having a facing surface 6a facing an upper surface (major surface at an upper side) of the substrate W and a chamber 7 that houses the substrate W for processing of the substrate W by the processing liquid. A carry-in/carry-out port 7c for carrying the substrate W into the chamber 7 and carrying out the substrate W from the chamber 7 is formed in the chamber 7. The chamber 7 includes a shutter unit 7d that opens and closes the carry-in/carry-out port 7c.

The spin chuck 5 includes chuck pins 20, a spin base 21, a rotating shaft 22, and an electric motor 23 that rotates the rotating shaft 22 around the rotational axis C1.

The rotating shaft 22 extends in a vertical direction Z along the rotational axis C1. The rotating shaft 22 is a hollow shaft in the present preferred embodiment. An upper end of the rotating shaft 22 is coupled to a center of a lower surface of the spin base 21. The spin base 21 has a disk shape along a horizontal direction H. The plurality of chuck pins 20 that grip the substrate W, are disposed at intervals in a circumferential direction at a peripheral edge portion of an upper surface of the spin base 21. The substrate W is rotated around the rotational axis C1 by the rotating shaft 22 being rotated by the electric motor 23. In the following, an inner side in a rotational radius direction of the substrate W shall be referred to simply as the "radially inner side" and an outer side in a rotational radius direction of the substrate W shall be referred to simply as the "radially outer side."

The shielding plate 6 is formed to a disk shape having substantially the same diameter as the substrate W or a diameter not less than the substrate W. The shielding plate 6 is disposed substantially horizontally above the spin chuck 5. A hollow shaft 30 is fixed to a surface of the shielding plate 6 at a side opposite the facing surface 6a.

The processing unit 2 further includes a shielding plate supporting member 31, which extends horizontally and supports the shielding plate 6 via the hollow shaft 30, a shielding plate elevating/lowering unit 32, which is connected to the shielding plate 6 via the shielding plate supporting member 31 and drives elevation and lowering of the shielding plate 6, and a shielding plate rotating unit 33, which rotates the shielding plate 6 around the rotational axis C1. The shielding plate elevating/lowering unit 32 is capable of positioning the shielding plate 6 at any position (height) from a lower position (position shown in FIG. 9G to be described below) to an upper position (position shown in FIG. 9A to be described below). The lower position is a position in a movable range of the shielding plate 6 at which the facing surface 6a of the shielding plate 6 becomes closest to the substrate W. At the lower position, a distance between the upper surface of the substrate W and the facing surface 6a is not more than 2.5 mm. The upper position is a position in the movable range of the shielding plate 6 at which the facing surface 6a of the shielding plate 6 becomes farthest from the substrate W.

The shielding plate rotating unit 33 includes an electric motor incorporated at a tip of the shielding plate supporting member 31. A plurality of wirings 34 disposed inside the shielding plate supporting member 31 are connected to the electric motor. The plurality of wirings 34 include a power line that transmits power to the electric motor, and encoder line that outputs rotation information of the shielding plate 6. By detecting the rotation information of the shielding plate 6, the rotation of the shielding plate 6 can be controlled accurately.

The processing unit 2 further includes an exhaust bucket 40 that surrounds the spin chuck 5, a plurality of cups 41 and 42 (a first cup 41 and a second cup 42) that is disposed between the spin chuck 5 and the exhaust bucket 40, and a plurality of guards 43 to 45 (a first guard 43, a second guard 44, and a third guard 45) that receive processing liquid removed off the substrate W from the substrate W held by the spin chuck 5.

The processing unit 2 further includes a plurality of guard elevating/lowering units 46 to 48 (first guard elevating/lowering units 46, second guard elevating/lowering units 47, and third guard elevating/lowering units 48) that drive elevation and lowering of the plurality of guards 43 to 45, respectively. The guard elevating/lowering units may also be called guard lifters. In the present preferred embodiment, the respective guard elevating/lowering units 46 to 48 are provided in pairs so as to be point symmetrical with the rotational axis C1 of the substrate W as a center in plan view. The plurality of guards 43 to 45 can thereby be elevated and lowered with stability.

The exhaust bucket 40 includes a cylinder portion 40A of circular cylindrical shape, a plurality (two, in the present preferred embodiment) of projecting portions 40B that projects from the cylinder portion 40A to the radially outer side of the cylinder portion 40A, and a plurality of lid portions 40C that are mounted to upper ends of the plurality of projecting portions 40B. The plurality of guard elevating/lowering units 46 to 48 are disposed at the same positions as the projecting portions 40B in a circumferential direction of the cylinder portion 40A but further to the radially inner side than the projecting portions 40B. In detail, each of a set constituted of a first guard elevating/lowering unit 46, a second guard elevating/lowering unit 47, and a third guard elevating/lowering unit 48 is disposed at the same position as each projecting portion 40B in the circumferential direction of the cylinder portion 40A.

Each of the cups 41 and 42 is circular cylindrical. Each of the cups 41 and 42 surrounds the spin chuck 5 at a further radially inner side than the cylinder portion 40A of the exhaust bucket 40. The second cup 42 is disposed further to the radially outer side than the first cup 41. The second cup 42 is, for example, integral to the third guard 45 and is elevated and lowered together with the third guard 45. Each of the cups 41 and 42 has an upwardly-open annular groove. A recovery piping (not shown) or a waste liquid piping (not shown) is connected to the groove of each of the cups 41 and 42. The processing liquid that has been guided to a bottom portion of each of the cups 41 and 42 is recovered or discarded through the recovery piping or the waste liquid piping.

The guards 43 to 45 are disposed so as to surround the spin chuck 5 and the shielding plate 6 in plan view.

The first guard 43 includes a first cylindrical portion 43A, surrounding the spin chuck 5 at a further radially inner side than the cylinder portion 40A of the exhaust bucket 40, and a first extension portion 43B extending to the radially inner side from the first cylindrical portion 43A.

By the first guard elevating/lowering unit 46, the first guard 43 is elevated and lowered between a lower position, at which an upper end of the first guard 43 is positioned lower than the substrate W, and an upper position, at which the upper end of the first guard 43 is positioned higher than the substrate W. The first guard 43 can be positioned at a shielding plate facing position between the lower position and the upper position by being elevated and lowered by the first guard elevating/lowering unit 46. By the first guard 43 being positioned at the shielding plate facing position, (an upper side end of) the first extension portion 43B is made to face the shielding plate 6 from the horizontal direction H.

The second guard 44 includes a second cylindrical portion 44A, surrounding the spin chuck 5 at a further radially inner side than the first cylindrical portion 40A of the first guard 43, and a second extension portion 44B extending to the radially inner side from the second extension portion 44A. The second extension portion 44B is inclined with respect to the horizontal direction H so as to rise upward toward the radially inner side. The second extension portion 44B faces the first extension portion 43B from below.

By the second guard elevating/lowering unit 47, the second guard 44 is elevated and lowered between a lower position, at which an upper end of the second guard 44 is positioned lower than the substrate W, and an upper position, at which the upper end of the second guard 44 is positioned higher than the substrate W. The second guard 44 can be positioned at a substrate facing position and a shielding plate facing position between the lower position and the upper position by being elevated and lowered by the second guard elevating/lowering unit 47. By the second guard 44 being positioned at the substrate facing position, (an upper side end of) the second extension portion 44B is made to face the substrate W from the horizontal direction H. By the second guard 44 being positioned at the shielding plate facing position, (an upper side end of) the second extension portion 44B is made to face the shielding plate 6 from the horizontal direction H.

The third guard 45 includes a third cylindrical portion 45A, surrounding the spin chuck 5 at a further radially inner side than the second cylindrical portion 44A of the second guard 44, and a third extension portion 45B extending to the radially inner side from the third cylindrical portion 45A. The third extension portion 45B faces the second extension portion 44B from below.

By the third guard elevating/lowering unit 48, the third guard 45 is elevated and lowered between a lower position, at which an upper end of the third guard 45 is positioned lower than the substrate W, and an upper position, at which the upper end of the third guard 45 is positioned higher than the substrate W. The third guard 45 can be positioned at a substrate facing position between the lower position and the upper position by being elevated and lowered by the third guard elevating/lowering unit 48. By the third guard 45 being positioned at the substrate facing position, (an upper side end of) the third extension portion 45B is made to face the substrate W from the horizontal direction H.

In a state where the first guard 43 is positioned at the shielding plate facing position, the first guard 43 is capable of forming, together with the substrate W held by the spin chuck 5 and the shielding plate 6, a space A that is isolated from an ambient atmosphere. The ambient atmosphere is the atmosphere higher than the shielding plate 6 and the atmosphere at a further radially outer side than the first guard 43. In a state where the second guard 44 is positioned at the substrate facing position, the space A is defined from below by the second guard 44. The second guard 44 is thus an example of a lower side guard that defines the space A from below the first guard 43 and receives the processing liquid removed off the substrate W.

The processing unit 2 includes a lower surface nozzle 8 that supplies a heating fluid to a lower surface of the substrate W, and a chemical liquid nozzle 9 that supplies a chemical liquid, such as hydrofluoric acid, to the upper surface of the substrate W.

The lower surface nozzle 8 is inserted through the rotating shaft 22. The lower surface nozzle 8 has, at an upper end, a discharge port facing a lower surface center of the substrate W. A heating fluid, such as hot water, is supplied from a heating fluid supply source to the lower surface nozzle 8 via a heating fluid supply pipe 50. The heating fluid supply pipe 50 has interposed therein a heating fluid valve 51 that opens and closes a flow passage thereof. Hot water is water of higher temperature than room temperature and is, for example, water of 80° C. to 85° C. The heating fluid is not restricted to hot water and may be a gas, such as high temperature nitrogen gas, and suffices to be a fluid capable of heating the substrate W.

A chemical liquid is supplied from a chemical liquid supply source to the chemical liquid nozzle 9 via a chemical liquid supply pipe 53. The chemical liquid supply pipe 53 has interposed therein a chemical liquid valve 54 that opens and closes a flow passage thereof.

The chemical liquid is not restricted to hydrofluoric acid and may be a liquid including at least one among sulfuric acid, acetic acid, nitric acid, hydrochloric acid, hydrofluoric acid, ammonia water, hydrogen peroxide water, an organic acid (for example, citric acid, oxalic acid, etc.), an organic alkali (for example, TMAH: tetramethylammonium hydroxide, etc.), a surfactant, a corrosion inhibitor. As examples of a chemical liquid in which the above are mixed, SPM (sulfuric acid/hydrogen peroxide mixture), SC1 (ammonia-hydrogen peroxide mixture), etc., can be cited.

The chemical liquid nozzle 9 is moved in the vertical direction and the horizontal direction H by a chemical liquid nozzle moving unit 52 (see FIG. 2). By movement in the horizontal direction H, the chemical liquid nozzle 9 can be moved between a central position of facing a rotation center position of the upper surface of the substrate W and a retracted position of not facing the upper surface of the substrate W. The rotation center position of the upper surface of the substrate W is a position on the upper surface of the substrate W that intersects the rotational axis C1. The retracted position of not facing the upper surface of the substrate W is a position at an outer side of the spin base 21 in plan view.

The chemical liquid nozzle 9 has a stepwise bent shape. Specifically, the chemical liquid nozzle 9 includes a nozzle tip portion 9A, extending downward and discharging the chemical liquid, a first horizontal portion 9B, extending horizontally from an upper end of the nozzle tip portion 9A, a second horizontal portion 9C, extending horizontally at a position higher than the first horizontal portion 9B, and a connecting portion 9D, extending in a direction that is inclined with respect to the horizontal direction H and connecting the first horizontal portion 9B and the second horizontal portion 9C.

With this arrangement, the chemical liquid nozzle 9 is capable of supplying the chemical liquid from a position close to the upper surface of the substrate W while avoiding interference with the shielding plate 6 in a state where the space A is not formed. Specifically, the first horizontal portion 9B is made to enter between the shielding plate 6 and the substrate W by moving the chemical liquid nozzle 9 toward the central position in a state where the connecting portion 9D is at a position of facing the shielding plate 6 from the horizontal direction H. The nozzle tip portion 9A can then be made to approach the upper surface of the substrate W by moving the chemical liquid nozzle 9 downward to a degree such that the connecting portion 9D does not contact the first extension portion 43B of the first guard 43.

Due to thus having the stepwise bent shape, the chemical liquid nozzle 9 can readily enter between the facing surface 6a of the shielding plate 6 and the upper surface of the substrate W. The upper position of the shielding plate 6 can thus be set low and the chamber 7 can thus be made compact in the vertical direction Z.

Also, by the chemical liquid nozzle 9 that supplies the chemical liquid to the upper surface of the substrate W in a state where the nozzle tip portion 9A is close to the upper surface of the substrate W, splashing back of the chemical liquid from the upper surface of the substrate W is reduced.

The processing unit 2 further includes a DIW nozzle 10 that supplies deionized water (DIW) as a rinse liquid to a central region of the upper surface of the substrate W, a central IPA nozzle 11 that supplies IPA as an organic solvent to the central region of the upper surface of the substrate W, and an inert gas nozzle 12 that supplies nitrogen gas (N2) or other inert gas to the central region of the upper surface of the substrate W. The central region of the upper surface of the substrate W is a region around the center of the upper surface of the substrate W that includes a position of the upper surface of the substrate W that intersects the rotational axis C1.

In the present preferred embodiment, the nozzles 10 to 12 are housed in common in a nozzle housing member 35 inserted through the hollow shaft 30 and are capable of discharging DIW, IPA, and the inert gas, respectively. Tips of the respective nozzles 10 to 12 are disposed at substantially the same height as the facing surface 6a of the shielding plate 6. The respective nozzles 10 to 12 are capable of supplying DIW, IPA, and the inert gas, respectively, to the central region of the upper surface of the substrate W even in a state where the space A is formed.

DIW is supplied from a DIW supply source to the DIW nozzle 10 via a DIW supply pipe 55. The DIW supply pipe 55 has interposed therein a DIW valve 56 that opens and closes a flow passage thereof.

The DIW nozzle 10 may be a rinse liquid nozzle that supplies a rinse liquid other than DIW. As examples of the rinse liquid besides DIW, carbonated water, electrolyzed ion water, ozone water, aqueous hydrochloric acid solution of dilute concentration (of, for example, approximately 10 to 100 ppm), or reduced water (hydrogen water), etc., can be cited.

IPA is supplied from an IPA supply source to the central IPA nozzle 11 via a central IPA supply pipe 57. The central IPA supply pipe 57 has interposed therein a central IPA valve 58 arranged to open and close a flow passage thereof and a central IPA flow control valve 64 that adjusts a flow rate of the IPA supplied to the central IPA nozzle 11.

Although in the present preferred embodiment the central IPA nozzle 11 is arranged to supply IPA, it suffices to function as a central low surface tension liquid nozzle that supplies a low surface tension liquid of lower surface tension than water to the central region of the upper surface of the substrate W.

As the low surface tension liquid, an organic solvent, besides IPA, that does not react chemically (is poor in reactivity) with the upper surface of the substrate W and the pattern (see FIG. 15) formed on the substrate W may be used. More specifically, a liquid including at least one among IPA, HFE (hydrofluoroether), methanol, ethanol, acetone, and trans-1,2 dichloroethylene may be used as the low surface tension liquid. Also, the low surface tension liquid is not required to be constituted of just a single component and may be a liquid mixed with another component. For example, the low surface tension liquid may be a mixed liquid of an IPA liquid and pure water or a mixed liquid of an IPA liquid and an HFE liquid.

Nitrogen gas or other inert gas is supplied from an inert gas supply source to the inert gas nozzle 12 via an inert gas supply pipe 59. The inert gas supply pipe 59 has interposed therein an inert gas valve 60 that opens and closes a flow passage thereof. The inert gas is not restricted to nitrogen gas and is a gas that is inert with respect to the upper surface of the substrate W and the pattern and may, for example, be a noble gas, such as argon.

The processing unit 2 may further include a moving nozzle 17 that supplies a processing liquid to the upper surface of the substrate W (see FIG. 2). The moving nozzle 17 is moved in the vertical direction and the horizontal direction H by a moving nozzle moving unit 65. The processing liquid supplied from the moving nozzle 17 to the substrate W is, for example, a chemical liquid, a rinse liquid, or a low surface tension liquid, etc.

The processing unit 2 includes an IPA nozzle 13, which extends from an inner wall of the first guard 43 so as to be disposed inside the space A in the state where the space A is formed and supplies IPA to the upper surface of the substrate W, and an IPA nozzle moving unit 14, which is connected to the first guard 43 and moves the IPA nozzle 13 between the upper surface of the substrate W and the facing surface 6a of the shielding plate 6.

The IPA nozzle 13 is an example of a processing liquid supplying nozzle that extends from an inner wall of the first guard 43 so as to be disposed inside the space A in the state where the space A is formed and supplies a processing liquid to the upper surface of the substrate W.

IPA is supplied from an IPA supply source to the IPA nozzle 13 via an IPA supply pipe 61. The IPA supply pipe 61 has interposed therein an IPA valve 62 arranged to open and close a flow passage thereof and an IPA flow control valve 63 that adjusts a flow rate of the IPA supplied to the IPA nozzle 13. Referring to FIG. 2, inside the chamber 7, the IPA valve 62 and the IPA flow control valve 63 are disposed, together with the central IPA valve 58 and the central IPA flow control valve 64, in a region V surrounded by alternate long and two short dashes line shown in FIG. 2.

The IPA nozzle moving unit 14 is an example of a nozzle moving unit that moves the IPA nozzle 13 as the processing liquid supplying nozzle between the upper surface of the substrate W and the facing surface 6a.

The IPA nozzle moving unit 14 includes a nozzle supporting member 15, supporting the IPA nozzle 13, a driving unit 16, connected to the first guard 43 and driving the nozzle supporting member 15, and a driving force transmitting member 18 that transmits a driving force of the driving unit 16 to the nozzle supporting member 15 (see also FIG. 4 described below).

The IPA nozzle 13 extends in the horizontal direction H and is curved in plan view. In detail, the IPA nozzle 13 has an arcuate shape conforming to the first cylindrical portion 43A of the first guard 43. A discharge port 13a, discharging IPA in the vertical direction (downwards) toward the upper surface of the substrate W, is provided at a tip of the IPA nozzle 13.

The nozzle supporting member 15 has a form of a pivoting shaft that pivots around the central axis. The IPA nozzle 13 and the nozzle supporting member 15 may be formed integrally. By movement in the horizontal direction H, the IPA nozzle 13 can be moved between a central position of facing the rotation center position of the upper surface of the substrate W and a retracted position of not facing the upper surface of the substrate W. The retracted position is a position at the outer side of the spin base 21 in plan view. More specifically, the retracted position may be a position adjoining the first cylindrical portion 43A of the first guard 43 from the radially inner side.

The first extension portion 43B of the first guard 43 integrally includes an inclined portion 43C, inclined with respect to the horizontal direction H, and a flat portion 43D, flat with respect to the horizontal direction H. The flat portion 43D and the inclined portion 43C are juxtaposed in a rotation direction of the substrate W. The flat portion 43D projects higher than the inclined portion 43C so that the flat portion 43D is positioned higher than the inclined portion 43C toward the radially outer side. The flat portion 43D is disposed so as to overlap in plan view with the nozzle supporting member 15 and the IPA nozzle 13 in a state of being positioned at the outer side of the spin base 21. The flat portion 43D suffices to be disposed so as to overlap in plan view at least with the IPA nozzle 13 at the retracted position and the nozzle supporting member 15.

The second extension portion 44B of the second guard 44 faces the flat portion 43D from below. The second extension portion 44B is an example of a facing portion extending incliningly with respect to the horizontal direction H and faces the flat portion 43D from below.

A housing space B that is capable of housing the IPA nozzle 13, is formed between the first guard 43 and the second guard 44. The housing space B extends in the rotation direction of the substrate W in conformation to the first cylindrical portion 43A of the first guard 43 and has an arcuate shape in plan view. The housing portion B is a space that is defined by the first cylindrical portion 43A, the flat portion 43D, and the second extension portion 44B. In detail, the housing space B is defined from the radially outer side by the first cylindrical portion 43A, defined from above by the flat portion 43D, and defined from below by the second extension portion 44B. In a state of being housed in the housing space B, the IPA nozzle 13 positioned at the retracted position neighbors the flat portion 43D from below.

The flat portion 43D is flat in the horizontal direction H and the second extension portion 44B is inclined with respect to the horizontal direction H so as to rise upward toward the radially inner side. Therefore, even in a state where a radially inner side end of the second extension portion 44B is disposed closest to the radially inner side end of the first extension portion 43B of the first guard 43, the housing space B is formed between the first guard 43 and the second guard 44.

A penetrating hole 43E, penetrating through the flat portion 43D in the vertical direction Z, is formed in the flat portion 43D of the first guard 43. The nozzle supporting member 15 is inserted through the penetrating hole 43E. A seal member 49 (see FIG. 4 described below) of rubber, etc., is disposed between the nozzle supporting member 15 and an inner wall of the penetrating hole 43E. An interval between the nozzle supporting member 15 and the inner wall of the penetrating hole 43E is thereby sealed. The driving unit 16 and the driving force transmitting member 18 are disposed outside the space A.

The processing unit 2 includes a first bracket 70, mounted to the first guard elevating/lowering unit 46 and fixing the IPA nozzle moving unit 14 to the first guard 43, a base 71, which is supported by the first bracket 70 and on which the driving unit 16 is placed and fixed, and a second bracket 72, connected to the first guard 43 and supporting the base 71 at a further radially inner side of the substrate W than the first bracket 70. The first bracket 70 is an example of a moving unit fixing member. A portion 14A of the IPA nozzle moving unit 14 that is fixed by the first bracket 70 overlaps with the first guard elevating/lowering unit 46 in plan view.

The processing unit 2 includes a cover 73, fixed to an upper surface of the base 71 and covering a portion of the driving unit 16, and a bellows 74, disposed between the first guard 43 and a top plate 7a of the chamber 7 and being capable of extending and contracting vertically. The top plate 7a of the chamber 7 is an example of a fixed member, disposed above the first guard 43 and fixed in position in the vertical direction Z with respect to the spin chuck 5. A lower end of the bellows 74 is fixed to an upper end of the cover 73 and an upper end of the bellows 74 is fixed to the top plate 7a of the chamber 7.

Figure 4:
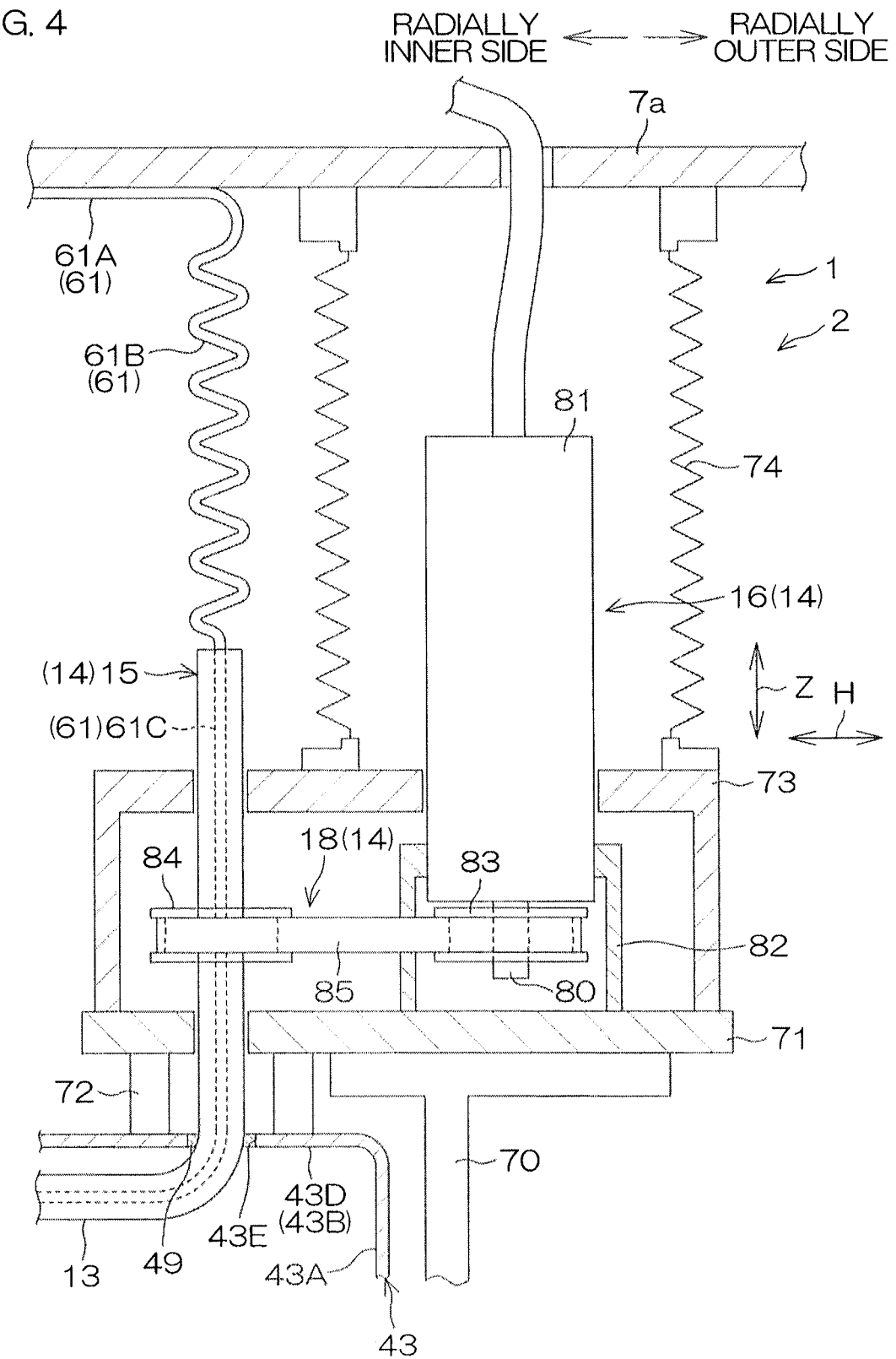
FIG. 4 is a schematic sectional view of a vicinity of a nozzle moving unit included in the processing unit.

FIG. 4 is a schematic sectional view of a vicinity of the driving unit 16.

The driving unit 16 includes a first rotating shaft 80 that extends vertically and a first driving motor 81 as a rotation driving source that rotates the first rotating shaft 80. The first driving motor 81 includes a motor housing of substantially rectangular parallelepiped shape.

The first driving motor 81 is fixed by a motor bracket 82, extending upward from the upper surface of the base 71, so that its length direction is directed vertically. The driving unit 16 may include a speed reducer (not shown) that reduces the speed of the rotation of the first rotating shaft 80 by the first driving motor 81 and an encoder (not shown) that detects rotation information of the first driving motor 81. Wiring, such as a power supply cable, is connected to an upper end of the first driving motor 81.

The driving force transmitting member 18 includes a pulley 83, fixed to the first rotating shaft 80 of the driving unit 16, a pulley 84, fixed to the nozzle supporting member 15, and a transmission belt 85, stretched between the pulleys 83 and 84.

When the first driving motor 81 of the driving unit 16 rotates the first rotating shaft 80, the transmission belt 85 rotates around the pulleys 83 and 84 and makes the nozzle supporting member 15 pivot via the pulley 84.

An upper end of the nozzle supporting member 15 is positioned higher than the cover 73. The nozzle supporting member 15 and the IPA nozzle 13 have forms of hollow shafts. An internal space of the nozzle supporting member 15 and an internal space of the IPA nozzle 13 are in communication. The IPA supply pipe 61 is inserted through the nozzle supporting member 15 from above.

The IPA supply pipe 61 integrally includes a rectilinear portion 61A, disposed along the top plate 7a of the chamber 7, an inserted portion 61C, inserted through the internal space of the nozzle supporting member 15 and the internal space of the IPA nozzle 13, and a coil portion 61B, extending vertically between the inserted portion 61C and the rectilinear portion 61A. The inserted portion 61C is connected to a vicinity of the discharge port 13a (see FIG. 3) at the tip of the IPA nozzle 13.

The arrangement of the shielding plate elevating/lowering unit 32 shall now be described in detail.

Figure 5:
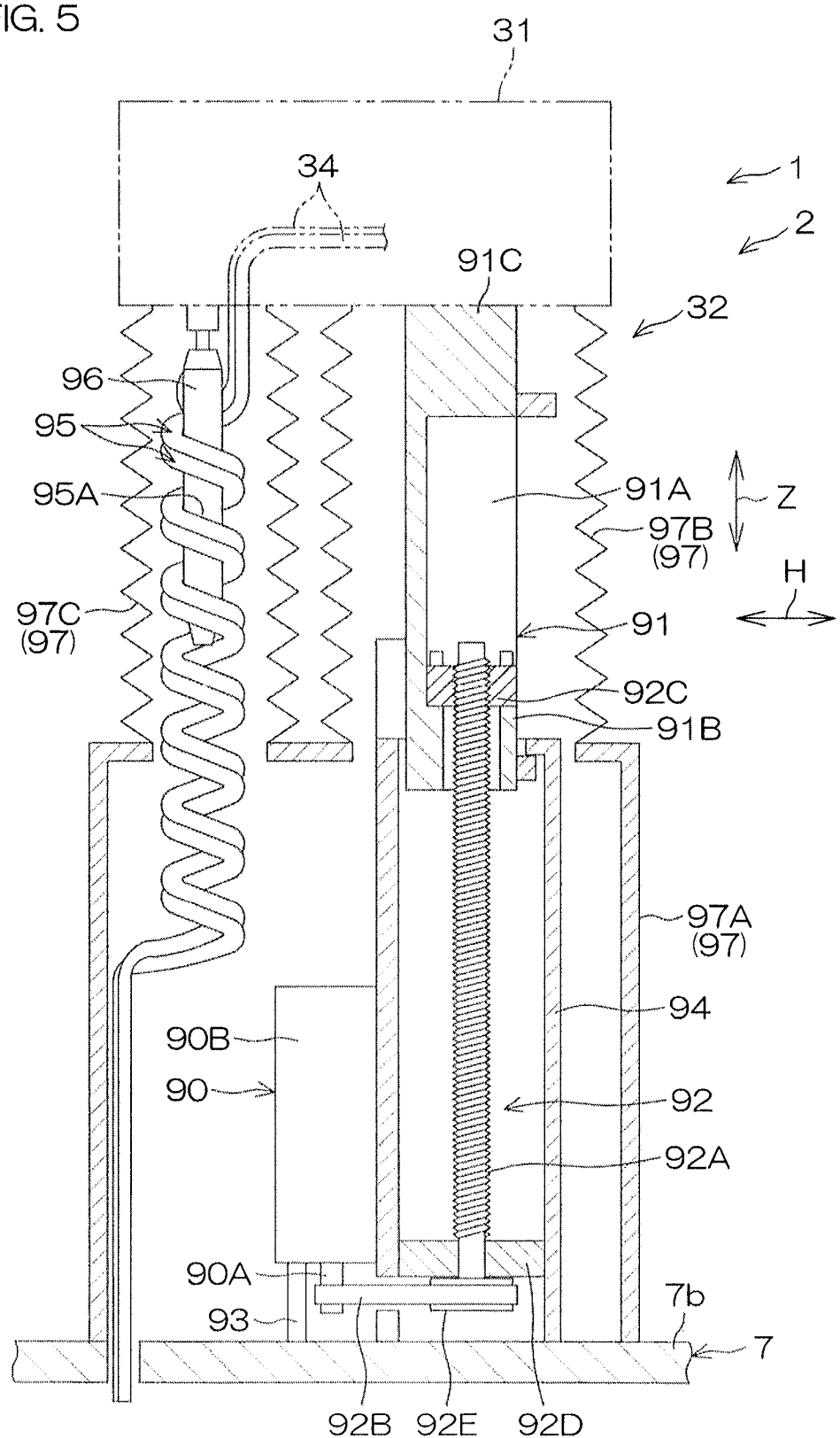
FIG. 5 corresponds to a sectional view taken along line V-V in FIG. 2 and is a schematic view of a vicinity of a shielding plate elevating/lowering unit included in the processing unit.

FIG. 5 corresponds to a sectional view taken along line V-V in FIG. 2 and is a schematic view of a vicinity of the shielding plate elevating/lowering unit 32.

The shielding plate elevating/lowering unit 32 includes a second driving source 90 that includes a second rotating shaft 90A that extends vertically, an elevating/lowering head 91 that is moved vertically, together with the shielding plate 6, by the second driving source 90, and a rotation transmitting unit 92 that transmits the rotation of the second rotating shaft 90A to the elevating/lowering head 91 to move the elevating/lowering head 91 vertically. The shielding plate elevating/lowering unit 32 further includes a first supporting bracket 93, supporting the second driving source 90, and a second supporting bracket 94, vertically movably supporting the elevating/lowering head 91.

The second driving source 90 further includes a second driving motor 90B as a rotation driving source that rotates the second rotating shaft 90A that vertically extends. The second driving motor 90B includes a motor housing of substantially rectangular parallelepiped shape.

The second driving motor 90B is fixed by the first supporting bracket 93, extending upward from a bottom plate 7b of the chamber 7, so that its length direction is directed vertically. The second driving source 90 may include a speed reducer (not shown) arranged to reduce the speed of the rotation of the second rotating shaft 90A by the second driving motor 90B and an encoder (not shown) arranged to detect a rotational speed of the second driving motor 90B. The second rotating shaft 90A of the second driving source 90 is supported by the second driving motor 90B. The second rotating shaft 90A extends downward from a lower end of the second driving motor 90B.

The elevating/lowering head 91 has a quadratic prism shape that extends in the vertical direction Z and is disposed at a side of the second driving source 90. The elevating/lowering head 91 has a recess 91A formed therein that notches the elevating/lowering head 91 from a side opposite the second driving source 90 side to the second driving source 90 side. The elevating/lowering head 91 has a lower plate portion 91B that defines the recess 91A from below and an upper plate portion 91C that defines the recess 91A from above.

The second supporting bracket 94 has a substantially rectangular cylindrical shape that extends upward from the bottom plate 7b of the chamber 7. The elevating/lowering head 91 is supported by the second supporting bracket 94. In detail, the elevating/lowering head 91 is supported so as to be capable of sliding along surfaces at both sides of a second driving source 90 side surface of the second supporting bracket 94.

The rotation transmitting unit 92 includes thread shaft 92A that vertically extends, a transmission belt 92B that transmits the rotation of the second rotating shaft 90A to the thread shaft 92A, and a nut 92C, fixed to the elevating/lowering head 91 and screwed onto the thread shaft 92A.

The thread shaft 92A is, for example, rotatably supported by the second supporting bracket 94 via a bearing 92D. The thread shaft 92A is inserted through an insertion hole provided in the lower plate portion 91B and an upper end thereof is positioned inside the recess 91A of the elevating/lowering head 91. The transmission belt 92B is stretched across a lower end of the second rotating shaft 90A and a pulley 92E mounted to a lower end of the thread shaft 92A. The nut 92C is housed inside the recess 91A and is fixed by a screw, etc., to the lower plate portion 91B.

Operations of the shielding plate elevating/lowering unit 32 shall now be described.

When the second driving motor 90B of the second driving source 90 rotates the second rotating shaft 90A, the transmission belt 92B rotates around the second rotating shaft 90A and the pulley 92E and rotates the thread shaft 92A via the pulley 92E. The rotation of the second rotating shaft 90A is converted to a rectilinear motion in the vertical direction Z of the elevating/lowering head 91, to which the nut 92C that is screwed onto the thread shaft 92A, is fixed, and the shielding plate 6 (see FIG. 3) is thus elevated or lowered. When the second driving motor 90B of the second driving source 90 stops the rotation of the second rotating shaft 90A, the vertical movement of the nut 92C screwed onto the thread shaft 92A stops and therefore the elevation/lowering of the shielding plate 6 is stopped.

The processing unit 2 includes a plurality of coiled wirings 95, which are capable of extending and contracting vertically and are electrically connected to the shielding plate 6 via the plurality of wirings 34, and a wiring guide 96, which is elevated and lowered along with the shielding plate 6 and guides the extension and contraction of the plurality of wirings 95. The same number of the plurality of wirings 95 are provided as the wirings 34, and a single wiring 34 is connected respectively to each wiring 95. As a whole, the plurality of wirings 95 form a cylindrical shape extending in the vertical direction Z and define a cylindrical space 95A extending in the vertical direction Z. The wiring guide 96 has an axial shape extending downward from the shielding plate supporting member 31. The wiring guide 96 is inserted through the cylindrical space 95A defined by the plurality of coiled wirings 95.

When the shielding plate 6 is lowered together with the elevating/lowering head 91, the coiled wirings 95 contract in the vertical direction Z by narrowing a pitch in the vertical direction Z while being guided by the wiring guide 96 that is lowered in the cylindrical space 95A. Oppositely, when the shielding plate 6 is elevated together with the elevating/lowering head 91, the coiled wirings 95 extend in the vertical direction Z by widening the pitch in the vertical direction Z while being guided by the wiring guide 96 that is elevated in the cylindrical space 95A.

The processing unit 2 further includes an isolating member 97, housing the shielding plate elevating/lowering unit 32 and isolating the shielding plate elevating/lowering unit 32 from an atmosphere inside the chamber 7. The isolating member 97 includes a housing 97A, fixed to the bottom plate 7b of the chamber 7, and a shielding plate first bellows 97B and a shielding plate second bellows 97C that are provided between the housing 97A and the shielding plate supporting member 31 and are capable of extending and contracting vertically.

The housing 97A houses the second driving source 90 and a lower side portion of the elevating/lowering head 91. The shielding plate bellows 97B and 97C are made, for example, of Teflon (registered trademark). The shielding plate first bellows 97B houses an upper side portion of the elevating/lowering head 91. The shielding plate second bellows 97C houses the plurality of wirings 95. The shielding plate bellows 97B and 97C extend and contract in the vertical direction Z when the shielding plate supporting member 31 moves vertically in accordance with the vertical movement of the elevating/lowering head 91.

In the present preferred embodiment, the shielding plate bellows 97B that houses the upper side portion of the elevating/lowering head 91 and the shielding plate second bellows 97C that houses the plurality of wirings 95 are provided. Therefore, in comparison to a form, where, unlike in the present preferred embodiment, a bellows housing both the upper side portion of the elevating/lowering head 91 and the plurality of wirings 95 is provided, a plan view size of the isolating member 97 can be suppressed. An installation space of the shielding plate elevating/lowering unit 32 can thus be reduced.

Figure 6A:
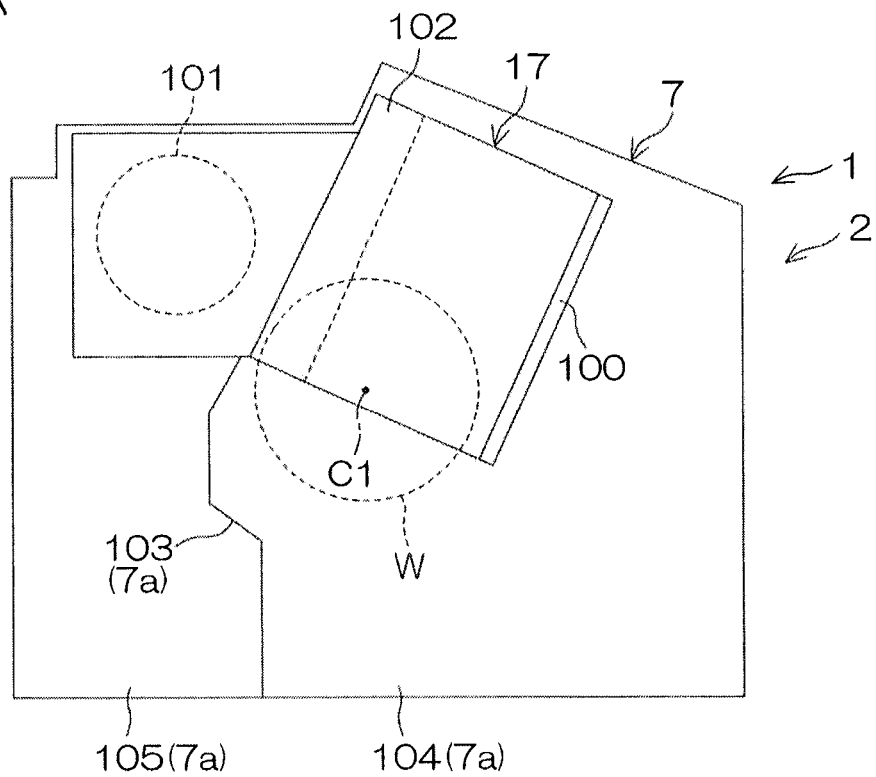
FIG. 6A is a schematic plan view of a chamber of the processing unit.
Figure 6B:
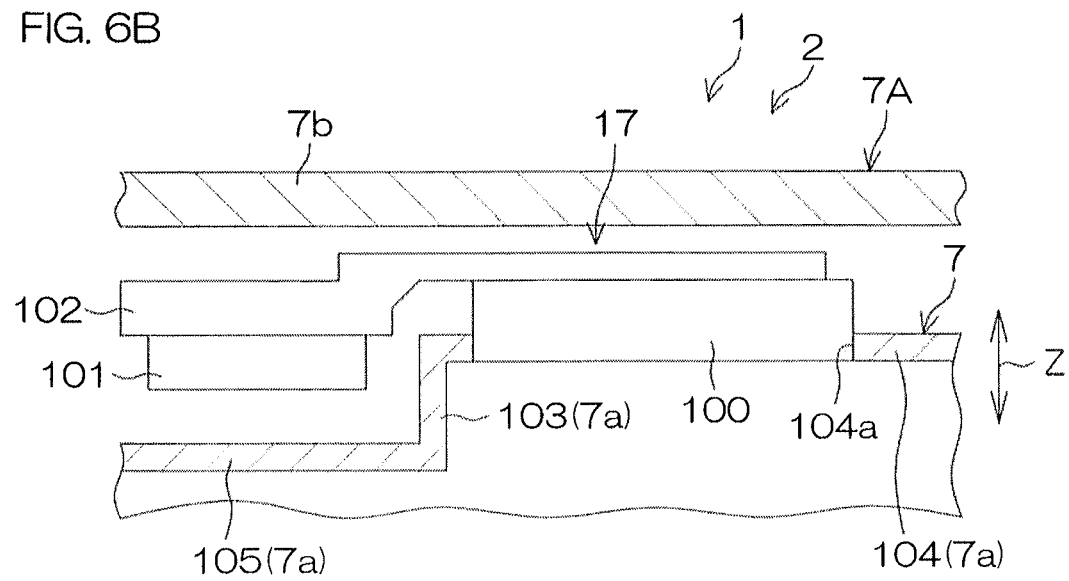
FIG. 6B is a schematic sectional view of a vicinity of an upper end portion of the chamber.

FIG. 6A is a schematic plan view of the chamber 7. FIG. 6B is a schematic sectional view of a vicinity of an upper end portion of the chamber 7.

The processing unit 2 includes an FFU (fan filter unit) 17 that delivers clean air (air filtered by a filter 100) from above the chamber 7 into the interior thereof. The FFU 17 is mounted from above onto the top plate 7a of the chamber 7.

The FFU 17 includes the filter 100, which filters air inside a clean room in which the substrate processing apparatus 1 is disposed, a fan 101, delivering air of an exterior of the chamber 7 toward the filter 100, and a duct 102, guiding the air delivered from the fan 101 to the filter 100.

At least a portion of the filter 100 overlaps with the substrate W in plan view. The filter 100 overlaps with the rotational axis C1 of the substrate W in plan view. The fan 101 is disposed at a position not overlapping with the substrate W in plan view. The filter 100 and the fan 101 are disposed at non-overlapping positions in plan view.

The top plate 7a of the chamber 7 is provided with a step 103. The top plate 7a includes an upper portion 104 and a lower portion 105 disposed above and below with the step 103 therebetween. The filter 100 is fixed to a penetrating hole 104a formed in the upper portion 104.

The fan 101 is disposed at the exterior of the chamber 7. In detail, the fan 101 is disposed at a position above the lower portion 105 that is a position lower than a bottom plate 7b of another chamber 7A disposed on the chamber 7.

By thus providing the top plate 7a of the chamber 7 with the step 103, a dimension of the processing unit 2 in the vertical direction Z can be suppressed while disposing the fan 101 at the exterior of the chamber 7. In other words, by providing the top plate 7a with the step 103, the FFU 17 can be disposed in a space at the exterior of the chamber 7 while enlarging a volume of the chamber 7.

The FFU 17 may include a punching plate (not shown) provided with a plurality of holes. The punching plate is mounted, for example, to a lower end of the filter 100. Generation of air vortices inside the chamber 7 can be prevented thereby.

Figure 7:
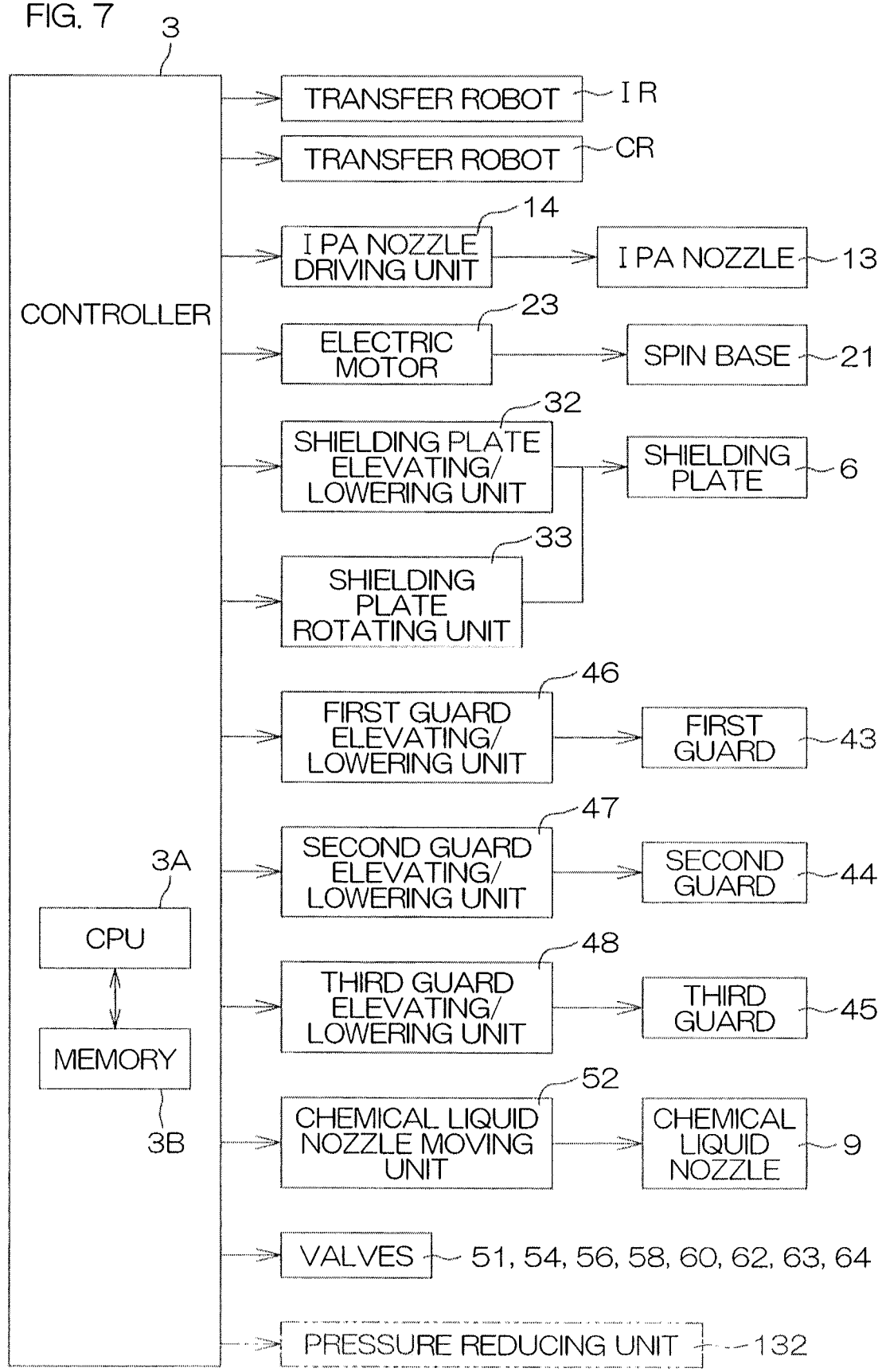
FIG. 7 is a block diagram for describing the electrical arrangement of a main portion of the substrate processing apparatus.

FIG. 7 is a block diagram for describing the electrical arrangement of a main portion of the substrate processing apparatus 1. The controller 3 includes a microcomputer and controls control objects included in the substrate processing apparatus 1 in accordance with a predetermined control program. More specifically, the controller 3 includes a processor (CPU) 3A and a memory 3B, in which the control program is stored, and is arranged to execute various controls for substrate processing by the processor 3A executing the control program.

In particular, the controller 3 is programmed to control the transfer robots IR and CR, the IPA nozzle moving unit 14, the electric motor 23, the shielding plate rotating unit 33, the shielding plate elevating/lowering unit 32, the guard elevating/lowering units 46 to 48, the chemical liquid nozzle moving unit 52, the valves 51, 54, 56, 58, 60, 62, 63, and 64, etc.

FIG. 8 is a flow diagram for describing an example of substrate processing performed by the substrate processing apparatus 1 and mainly shows the processing realized by the controller 3 executing an operation program. FIG. 9A to FIG. 9G are schematic sectional views of a principal portion of the processing unit 2 for describing conditions of the substrate processing.

In the substrate processing by the substrate processing apparatus 1, for example, carry-in of a substrate (S1), chemical liquid processing (S2), DIW rinse processing (S3), organic solvent processing (S4), drying processing (S5), and carry-out of the substrate (S6) are executed in that order as shown in FIG. 8.

Firstly, in the substrate processing by the substrate processing apparatus 1, an unprocessed substrate W is carried from the carrier C into a processing unit 2 and transferred to the spin chuck 5 by the transfer robots IR and CR (S1). Thereafter, until being carried out by the transfer robot CR, the substrate W is held horizontally by the spin chuck 5.

Figure 9A:
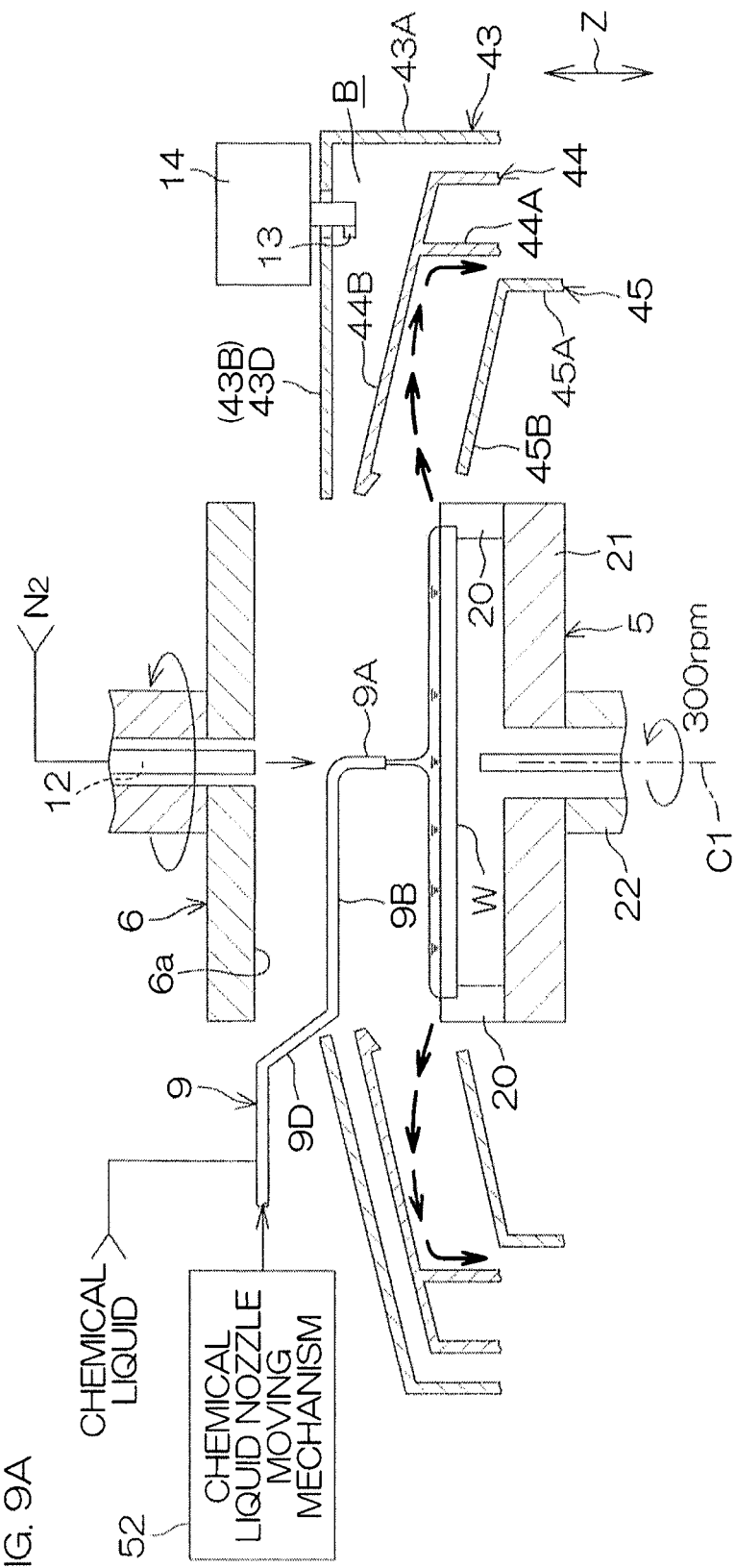

Next, with reference to FIG. 9A, the chemical liquid processing (S2) shall be described. After the transfer robot CR retracts out of the processing unit 2, the chemical liquid processing (S2) of cleaning the upper surface of the substrate W with the chemical liquid is executed.

Specifically, first, the controller 3 opens the inert gas valve 60 to make the inert gas (for example, N2 gas) be supplied from the inert gas nozzle 12 toward the upper surface of the substrate W. A flow rate of the inert gas during this process is, for example, a flow rate of 10 liters/min or less.

The controller 3 then controls the IPA nozzle moving unit 14 to position the IPA nozzle 13 at the retracted position. In a state where the IPA nozzle 13 is positioned at the retracted position, the controller 3 controls the first guard elevating/lowering unit 46 and the second guard elevating/lowering unit 47 to position the first guard 43 and the second guard 44 higher than the substrate W in a state of being brought close to each other in the vertical direction Z. The IPA nozzle 13 positioned at the retracted position is thereby housed inside the housing space B defined by the flat portion 43D of the first extension portion 43B of the first guard 43, the first cylindrical portion 43A of the first guard 43, and the second extension portion 44B of the second guard 44. Also, the controller 3 controls the third guard elevating/lowering unit 48 to position the third guard 45 at the substrate facing position.

The controller 3 then drives the electric motor 23 to rotate the spin base 21 at a predetermined chemical liquid speed. The chemical liquid speed is, for example, 300 rpm. The controller 3 may also control the shielding plate rotating unit 33 to rotate the shielding plate 6. During this process, the shielding plate 6 rotates synchronously with the spin base 21. Synchronous rotation refers to rotation in the same direction at the same rotational speed. The controller 3 then controls the shielding plate elevating/lowering unit 32 to position the shielding plate 6 at the upper position. The controller 3 controls the chemical liquid nozzle moving unit 52 to position the chemical liquid nozzle 9 at a chemical liquid processing position above the substrate W.

The chemical liquid processing position may be a position at which the chemical liquid discharged from the chemical liquid nozzle 9 lands at a rotation center of the upper surface of the substrate W. The controller 3 then opens the chemical liquid valve 54. The chemical liquid is thereby supplied from the chemical liquid nozzle 9 toward the upper surface of the substrate W in the rotating state. The supplied chemical liquid spreads across an entirety of the upper surface of the substrate W due to a centrifugal force.

The chemical liquid that splashed outside the substrate due to the centrifugal force (see thick line arrows at sides of the substrate W) passes between the second extension portion 44B of the second guard 44 and the third extension portion 45B of the third guard 45 and is received by the second cylindrical portion 44A of the second guard 44. The chemical liquid received by the second cylindrical portion 44A flows toward the second cup 42 (see FIG. 3). During this process, the IPA nozzle 13 is housed in the housing space B defined by the flat portion 43D and the first cylindrical portion 43A of the first guard 43 and the second extension portion 44B of the second guard 44. Contamination of the IPA nozzle 13 by the chemical liquid splashed from the upper surface of the substrate W can thus be suppressed or prevented.

Figure 9C:
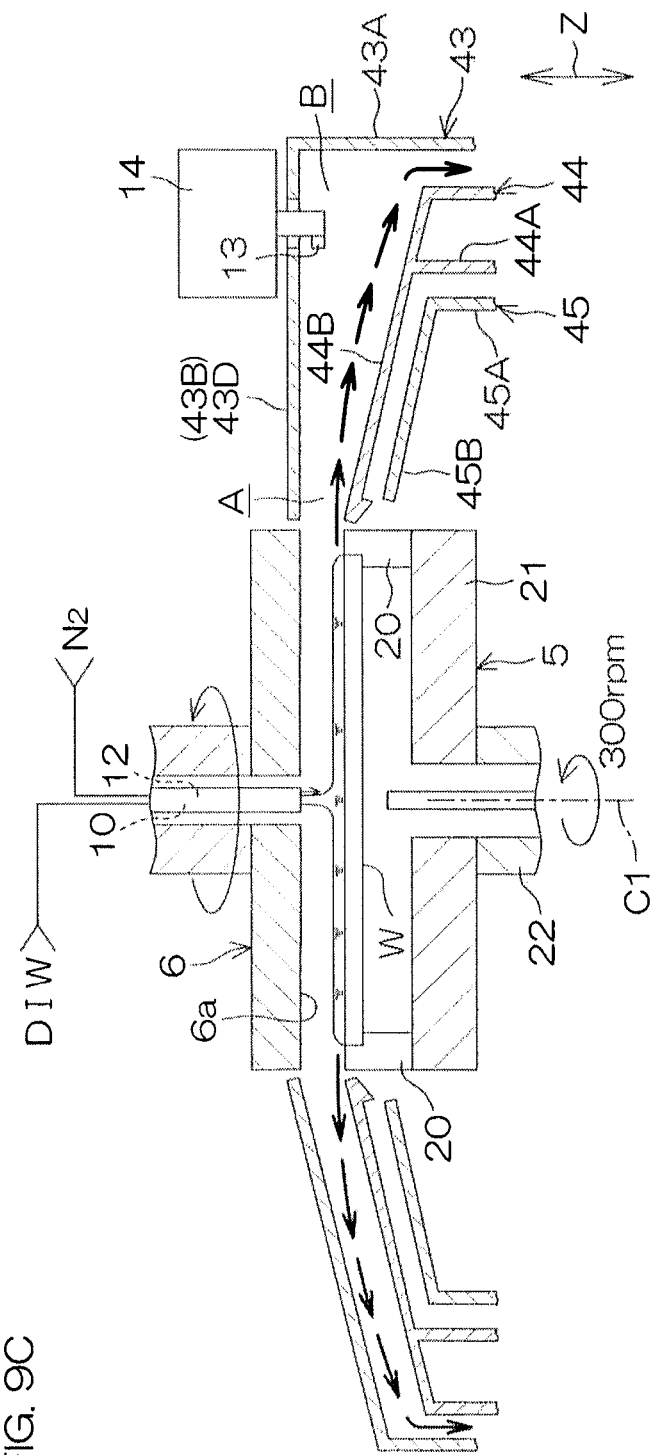

The DIW rinse processing (S3) shall now be described with reference to FIG. 9B and FIG. 9C.

After the chemical liquid processing (S2) of a fixed time, the DIW rinse processing (S3) for replacing the chemical liquid on the upper surface of the substrate W by the DIW to remove the chemical liquid from the substrate W is executed (step S3).

Specifically, with reference to FIG. 9B, the controller 3 closes the chemical liquid valve 54. The controller 3 controls the chemical liquid nozzle moving unit 52 to make the chemical liquid nozzle 9 retract from above the substrate W to a side of the spin base 21.

The controller 3 controls the guard elevating/lowering units 46 to 48 to position the first guard 43, the second guard 44, and the third guard 45 higher than the substrate W. In this state, the housing space B is formed in the same manner as the chemical liquid process and the IPA nozzle 13 positioned at the retracted position is housed inside the housing space B.

The controller 3 then opens the DIW valve 56. DIW is thereby supplied from the DIW nozzle 10 toward the upper surface of the substrate W in the rotating state. The supplied DIW spreads across the entirety of the upper surface of the substrate W due to the centrifugal force. The chemical liquid on the substrate W is rinsed off by the DIW.

The supplying of the inert gas by the inert gas nozzle 12 and the rotation of the substrate W by the spin base 21 are continued in the DIW rinse processing as well. The flow rate of the inert gas in the DIW rinse processing is, for example, a flow rate of 10 liters/min or less.

The substrate W is rotated at a predetermined first DIW rinse speed. The first DIW rinse speed is, for example, 300 rpm. The controller 3 may also control the shielding plate rotating unit 33 to rotate the shielding plate 6. During this process, the shielding plate 6 rotates synchronously with the spin base 21. The controller 3 controls the shielding plate elevating/lowering unit 32 to maintain the state where the shielding plate 6 is positioned at the upper position.

The chemical liquid and DIW that splashed outside the substrate W due to the centrifugal force (see the thick line arrows at sides of the substrate W) pass below the third extension portion 45B of the third guard 45 and are received by the third cylindrical portion 45A of the third guard 45. The chemical liquid and DIW received by the third cylindrical portion 45A flows toward the first cup 41 (see FIG. 3). During this process, the IPA nozzle 13 is housed in the housing space B defined by the flat portion 43D and the first cylindrical portion 43A of the first guard 43 and the second extension portion 44B of the second guard 44. Contamination of the IPA nozzle 13 by the chemical liquid and DIW splashed from the upper surface of the substrate W can thus be suppressed or prevented.

Then, with reference to FIG. 9, in the state where the DIW is supplied from the nozzle 10 toward the upper surface of the substrate W in the rotating state, the controller 3 controls the shielding plate elevating/lowering unit 32 to move the shielding plate 6 from the upper position to a first proximity position. The first proximity position is a position at which the facing surface 6a of the shielding plate 6 is disposed close to the upper surface of the substrate W and is a position at which a distance between the upper surface of the substrate W and the facing surface 6a is not more than 7 mm.

Unlike in the present preferred embodiment, the controller 3 may control the shielding plate elevating/lowering unit 32 to move the shielding plate 6 from the upper position to a second proximity position. The second proximity position is a position at which the facing surface 6a of the shielding plate 6 is disposed close to the upper surface of the substrate W and is a position higher than the first proximity position. The facing surface 6a when the shielding plate 6 is positioned at the second proximity position is positioned higher than the facing surface 6a when the shielding plate 6 is positioned at the first proximity position. The distance between the facing surface 6a of the shielding plate 6 positioned at the second proximity position and the upper surface of the substrate W is approximately 15 mm.

The controller 3 then controls the guard elevating/lowering units 46 to 48 to position the first guard 43 at the shielding plate facing position and position the second guard 44 at the substrate facing position. The space A is thereby formed by the substrate W, the first guard 43, and the second guard 44.

The controller 3 then controls the inert gas valve 60 to set the flow rate of the inert gas supplied from the inert gas nozzle 12 at a predetermined replacing flow rate. The replacing flow rate is, for example, 300 liters/min. An atmosphere inside the space A is thereby replaced by the inert gas. The inert gas nozzle 12 is thus included in an inert gas supplying unit that supplies the inert gas into the space A to replace the atmosphere inside the space A by the inert gas.

The controller 3 controls the electric motor 23 to rotate the spin base 21 at a predetermined second DIW rinse speed. The second DIW rinse speed is, for example, 300 rpm. The controller 3 may also control the shielding plate rotating unit 33 to rotate the shielding plate 6. During this process, the shielding plate 6 undergoes synchronous rotation with the spin base 21.

The chemical liquid and DIW that splashed outside the substrate W due to the centrifugal force (see the thick line arrows at sides of the substrate W) pass between the first extension portion 43B of the first guard 43 and the second extension portion 44B of the second guard 44 and are received by the first cylindrical portion 43A of the first guard 43.

As mentioned above, the flat portion 43D, which demarcates the housing space B from above, projects higher than the inclined portion 43C so that, toward the radially outer side, it is positioned higher than the inclined portion 43C. Also as mentioned above, the IPA nozzle 13 positioned at the retracted position adjoins the flat portion 43D from below. Therefore, even when the chemical liquid and DIW that splashed from the upper surface of the substrate W pass between the first extension portion 43B and the second extension portion 44B, contamination of the IPA nozzle 13 can be suppressed in comparison to an arrangement where the IPA nozzle 13 positioned at the retracted position adjoins the inclined portion 43C from below.

Next, the organic solvent processing (S4) shall be described with reference to FIG. 9D to FIG. 9F. After the DIW rinse processing (S3) of a fixed time, the organic solvent processing (S4) of replacing the DIW on the substrate W by the organic solvent (for example, IPA) that is the low surface tension liquid of lower surface tension than water is executed. The substrate W may be heated while the organic solvent processing is being executed. Specifically, the controller 3 opens the heating fluid valve 51 to make the heating fluid be supplied from the lower surface nozzle 8 to thereby heat the substrate W.

Figure 9D:
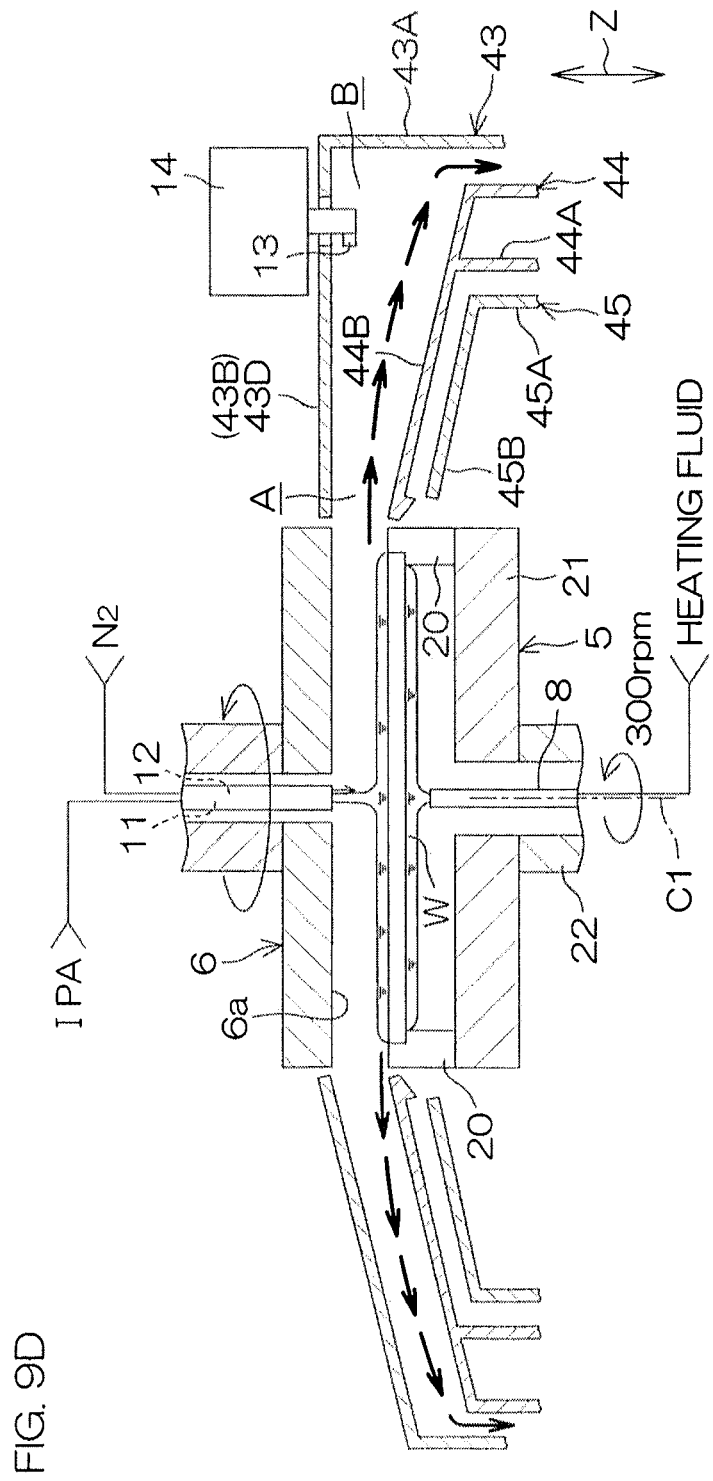

With reference to FIG. 9D, in the organic solvent processing, first, an IPA replacing step of replacing the DIW on the upper surface of the substrate W by IPA is executed.

The controller 3 controls the shielding plate elevating/lowering unit 32 to move the shielding plate 6 from the first proximity position to the second proximity position.

The controller 3 then controls the guard elevating/lowering units 46 to 48 to move and position the first guard 43 at the shielding plate facing position in accordance with the movement of the shielding plate 6 and to move and position the second guard 44 at the substrate facing position in accordance with the movement of the shielding plate 6. The shielding plate 6 is thereby moved from the first proximity position to the second proximity position with the state where the space A is formed being maintained.

The controller 3 closes the DIW valve 56. The supplying of DIW from the DIW nozzle 10 is thereby stopped. The controller 3 opens the central IPA valve 58. IPA is thereby supplied from the central IPA nozzle 11 toward the upper surface of the substrate W in the rotating state. The supplied IPA spreads across the entirety of the upper surface of the substrate W due to the centrifugal force and the DIW on the substrate W is replaced by the IPA. In an interval until the DIW on the substrate W is replaced by the IPA, the controller 3 drives the electric motor 23 to rotate the spin base 21 at a predetermined replacing speed. The replacing speed is, for example, 300 rpm.

The DIW and IPA that splashed outside the substrate due to the centrifugal force (see the thick line arrows at sides of the substrate W) pass between the first extension portion 43B of the first guard 43 and the second extension portion 44B of the second guard 44 and are received by the first cylindrical portion 43A of the first guard 43.

As mentioned above, the flat portion 43D, which defines the housing space B from above, projects higher than the inclined portion 43C so that the flat portion 43D is positioned higher than the inclined portion 43C toward the radially outer side. Also, as mentioned above, the IPA nozzle 13 positioned at the retracted position adjoins the flat portion 43D from below. Therefore, even when the DIW and IPA that splashed from the upper surface of the substrate W pass between the first extension portion 43B and the second extension portion 44B, contamination of the IPA nozzle 13 can be suppressed in comparison to an arrangement where the IPA nozzle 13 positioned at the retracted position adjoins the inclined portion 43C from below.

Figure 9E:
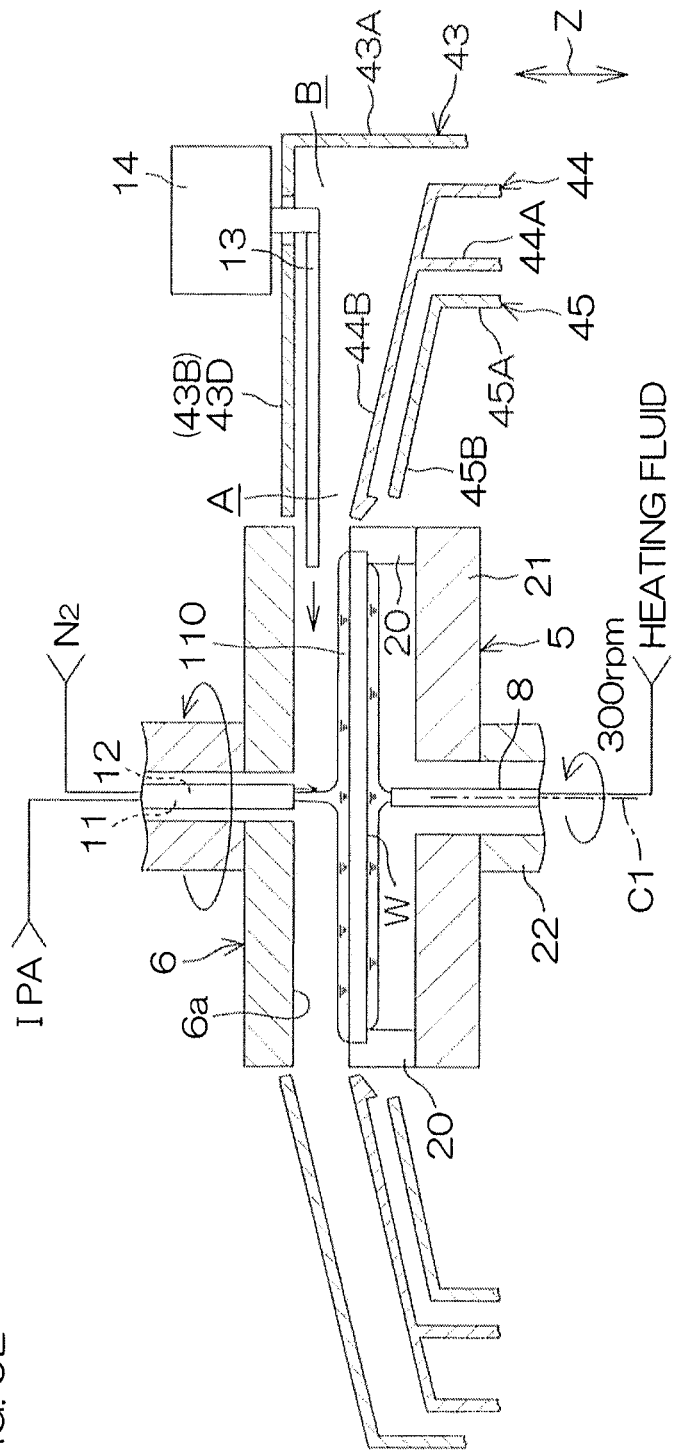

With reference to FIG. 9E, a liquid film forming step of forming a liquid film 110 of IPA is performed next in the organic solvent processing.

By continuing to supply IPA to the upper surface of the substrate W, the liquid film 110 of IPA is formed on the upper surface of the substrate W. To form the liquid film 110 of IPA, the controller 3 drives the electric motor 23 to rotate the spin base 21 at a predetermined liquid film forming speed. The liquid film forming speed is, for example, 300 rpm.

The controller 3 may also control the shielding plate rotating unit 33 to rotate the shielding plate 6. During this process, the shielding plate 6 rotates synchronously with the spin base 21.

Then, in an interval until the liquid film 110 of IPA is formed on the substrate W, the controller 3 controls the IPA nozzle moving unit 14 to move the IPA nozzle 13 toward a processing position. The processing position is a position that is shifted slightly (for example, by approximately 30 mm) toward a peripheral edge side of the substrate W from the central region of the substrate W. The IPA nozzle 13 is capable of being moved between the facing surface 6a of the shielding plate 6 and the upper surface of the substrate W when the shielding plate 6 is positioned at least at the second proximity position or at a position higher than the second proximity position. The IPA nozzle 13 may also be capable of being moved between the facing surface 6a of the shielding plate 6 and the upper surface of the substrate W when the shielding plate 6 is positioned at the first proximity position.

Figure 9F:
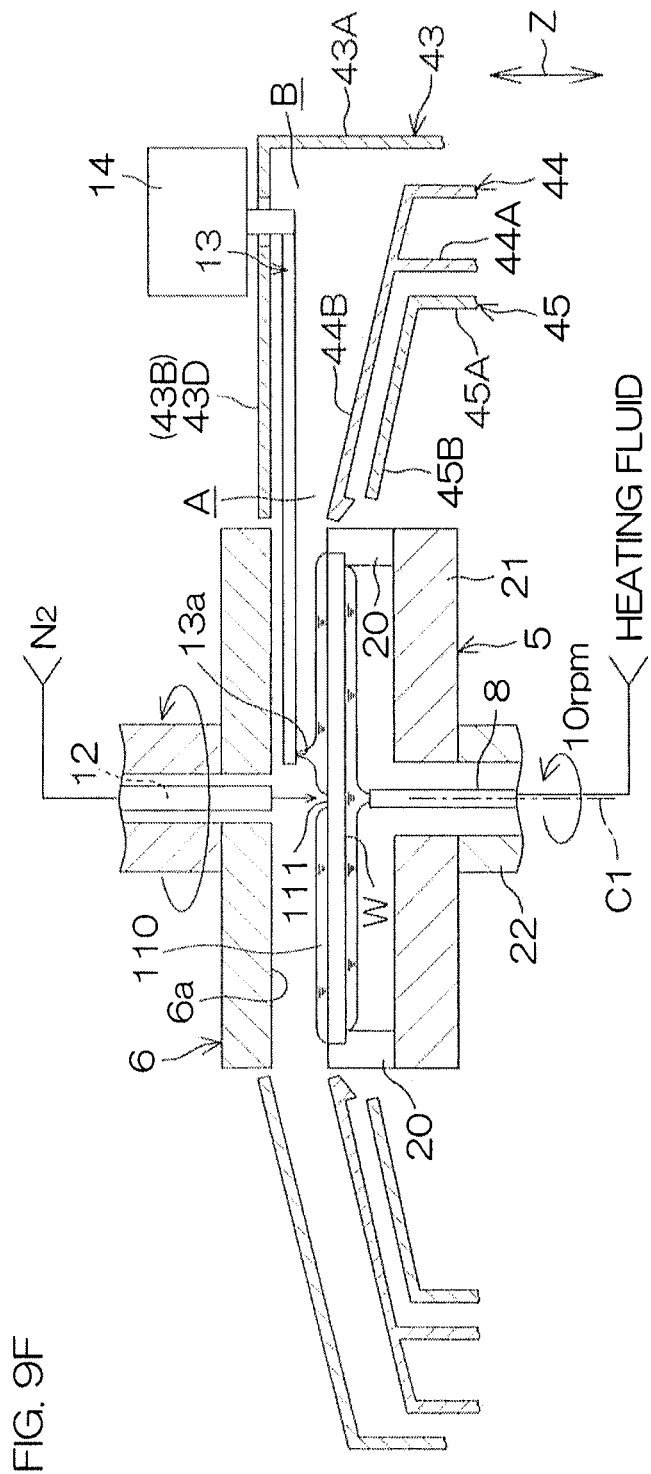

Referring to FIG. 9F, a liquid film removing step of removing the liquid film 110 of IPA from the upper surface of the substrate W is performed next in the organic solvent processing.

In the liquid film removing step, first, the controller 3 closes the central IPA valve 58 to stop the supplying of IPA to the upper surface of the substrate W by the central IPA nozzle 11. The controller 3 then controls the inert gas valve 60 to make the inert gas (for example, N2 gas) be blown on perpendicularly toward the central region of the upper surface of the substrate W from the inert gas nozzle 12 at, for example, 3 liters/min. A small opening 111 (for example, of approximately 300 mm diameter) is thereby opened in a central region of the liquid film 110 and the central region of the upper surface of the substrate W becomes exposed.

In the liquid film removing step, the opening 111 does not necessarily have to be formed by the blowing-on of the inert gas. For example, the opening 111 may be formed in the central region of the liquid film 110, without blowing on the inert gas, by making the IPA at the central region evaporate by heating the substrate W by supplying the heating fluid to the central region of the lower surface of the substrate W by means of the lower surface nozzle 8. Also, the opening 111 may be formed in the liquid film 110 by both the blowing-on of the inert gas onto the upper surface of the substrate W and the heating of the central region of the lower surface of the substrate W by the heating fluid.

The controller 3 controls the electric motor 23 to decelerate the rotation of the spin base 21 gradually to a predetermined liquid film removing speed. The liquid film removing speed is, for example, 10 rpm. The liquid film removing speed is not restricted to 10 rpm and is changeable in a range of 10 rpm to 30 rpm. The controller 3 may also control the shielding plate rotating unit 33 to rotate the shielding plate 6. During this process, the shielding plate 6 rotates synchronously with the spin base 21.

The opening 111 is enlarged by the centrifugal force due to the rotation of the substrate W and the IPA liquid film is removed gradually from the upper surface of the substrate W. The blowing-on of the inert gas by the inert gas nozzle 12 may be continued during an interval until the liquid film 110 is removed from the upper surface of the substrate W, that is, until the liquid film removing step is completed. The enlargement of the opening 111 is promoted by force being added to the liquid film 110 of IPA by the blowing-on force of the inert gas.

While enlarging the opening 111, the controller 3 controls the IPA valve 62 to start supplying of IPA to the upper surface of the substrate W from the IPA nozzle 13. The temperature of the IPA supplied from the IPA nozzle 13 is preferably higher than room temperature and is, for example, 50° C. In this process, the controller 3 sets a liquid landing point of the IPA supplied from the IPA nozzle 13 at an outside of the opening 111. The outside of the opening 111 refers to a side opposite the rotational axis C1 with respect to a peripheral edge of the opening 111.

The controller 3 controls the IPA nozzle moving unit 14 to move the IPA nozzle 13 toward a peripheral edge of the substrate W in accordance with the enlargement of the opening 111. Sufficient IPA is thereby supplied to the liquid film 110. Localized elimination of IPA further outside than the peripheral edge of the opening 111 due to evaporation or the centrifugal force can thus be suppressed. The organic solvent processing (S4) ends, for example, at a point in time at which a position of supplying of IPA to the liquid film 110 by the IPA nozzle 13 reaches the peripheral edge of the substrate W. Or, the organic solvent processing (S4) may end at a point in time at which the peripheral edge of the opening 111 reaches the peripheral edge of the substrate W.

Figure 9G:
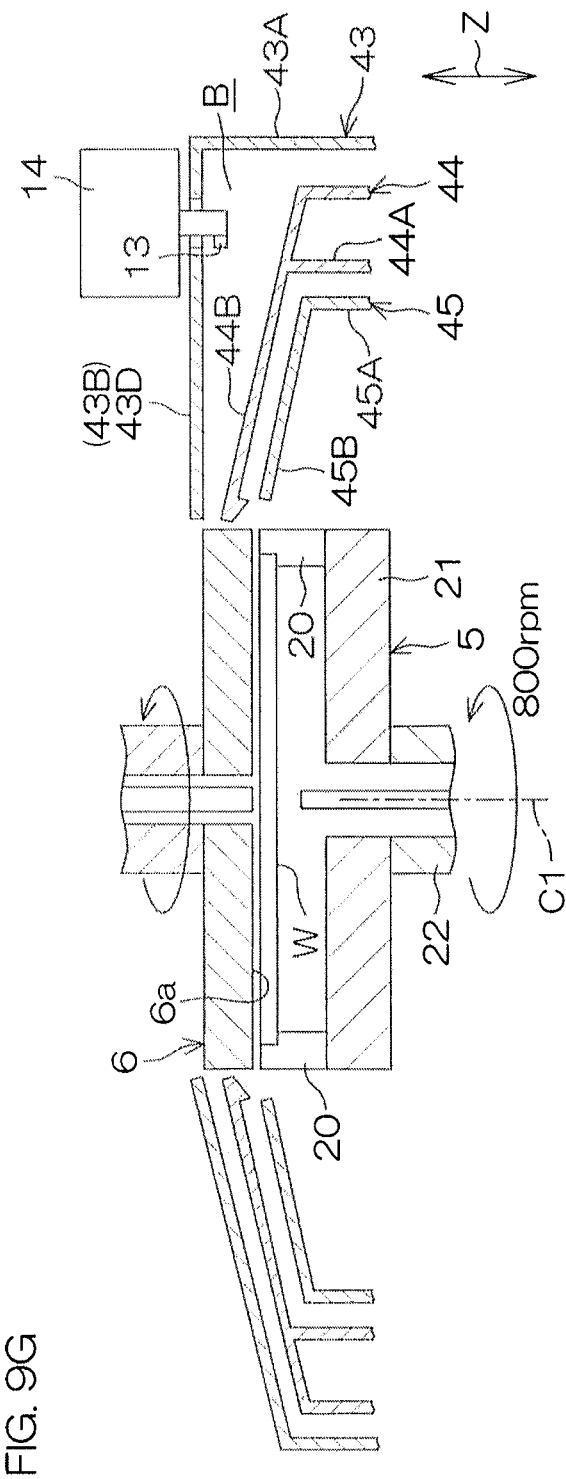

Next, the drying processing (S5) shall be described with reference to FIG. 9G. After the organic solvent processing (S4) ends, the drying processing (S5: spin drying) for spinning off the liquid component on the upper surface of the substrate W by the centrifugal force is executed.

Specifically, the controller 3 closes the heating fluid valve 51, the IPA valve 62, and the inert gas valve 60. The controller 3 then controls the IPA nozzle moving unit 14 to make the IPA nozzle 13 retract to the retracted position. The controller 3 then controls the shielding plate elevating/lowering unit 32 to move the shielding plate 6 to the lower position.

The controller 3 then controls the electric motor 23 to make the substrate W undergo high speed rotation at a drying speed. The drying speed is, for example, 800 rpm. The liquid components on the substrate W are thereby spun off by the centrifugal force. The controller 3 may also control the shielding plate rotating unit 33 to rotate the shielding plate 6. During this process, the shielding plate 6 undergoes synchronous rotation with the spin base 21.

Thereafter, the controller 3 controls the electric motor 23 to stop the rotation of the spin chuck 5. The controller 3 then controls the shielding plate elevating/lowering unit 32 to make the shielding plate 6 retract to the upper position. The controller 3 then controls the guard elevating/lowering units 46 to 48 to move the guards 43 to 45 to the lower positions lower than the substrate W.

Thereafter, the transfer robot CR enters into the processing unit 2, lifts up the processed substrate W from the spin chuck 5, and carries it out of the processing unit 2 (S6). The substrate W is transferred from the transfer robot CR to the transfer robot IR and is housed in a carrier C by the transfer robot IR.

With the present preferred embodiment, the IPA nozzle 13 extends from the inner wall of the first guard 43 that is disposed so as to surround the spin base 21 and the shielding plate 6 in plan view. Therefore, in comparison to an arrangement where the IPA nozzle 13, the IPA nozzle moving unit 14, or other member is mounted to the shielding plate 6, the shielding plate 6 can be disposed in a state where the facing surface 6a is brought sufficiently close to the upper surface of the substrate W. The space A formed by the substrate W and the shielding plate 6 can thus be made small. By supplying the inert gas from the inert gas nozzle 12 in this state to replace the atmosphere inside the space A by the inert gas, oxygen concentration and humidity of the atmosphere between the substrate W and the shielding plate 6 can be reduced promptly.

Also, the IPA nozzle 13 is disposed inside the space A. The IPA nozzle 13 can thus supply the IPA to the upper surface of the substrate W in a state where the atmosphere inside the space A is replaced by the inert gas, that is, in a state where a concentration of the IPA in the atmosphere is reduced. The IPA supplied to the upper surface of the substrate W from the IPA nozzle 13 can thus be made to evaporate promptly.

Also, the IPA nozzle moving unit 14 that moves the IPA nozzle 13 between the upper surface of the substrate W and the facing surface 6a is connected to the first guard 43. The oxygen concentration and the humidity of the atmosphere between the substrate W and the shielding plate 6 can thereby be reduced while moving the IPA nozzle 13 inside the space A that the first guard 43 forms together with the substrate W and the shielding plate 6.

Also, by means of the IPA nozzle moving unit 14 with a simple arrangement that includes the nozzle supporting member 15 and the driving unit 16, the IPA nozzle 13 can be moved inside the space A, which the first guard 43 forms together with the substrate W and the shielding plate 6.

Also, the nozzle supporting member 15 is inserted through the penetrating hole 43E formed in the first guard 43. In the state where the first guard 43, together with the substrate W and the shielding plate 6, forms the space A, the driving unit 16 is disposed outside the space A. Movement of the IPA nozzle 13 inside the space A is thus enabled regardless of the size of the driving unit 16 and the space A can be made small. Also, the interval between the nozzle supporting member 15 and the penetrating hole 43E is sealed by the seal member 49 and therefore a degree of sealing of the space A can be improved.

Also, the first bracket 70 is mounted to the first guard elevating/lowering unit 46. The portion 14A of the IPA nozzle moving unit 14 that is fixed by the first bracket 70 overlaps with the first guard elevating/lowering unit 46 in plan view. The first guard elevating/lowering unit 46 is thereby capable of receiving the IPA nozzle moving unit 14 via the first bracket 70. The weight that the first guard 43 receives from the IPA nozzle moving unit 14 can thus be reduced and therefore damage and deformation of the first guard 43 due to aging degradation can be suppressed. The first guard 43 can thus form the space A with stability even after use over a long term and therefore the oxygen concentration and the humidity of the atmosphere between the substrate W and the shielding plate 6 can be reduced even after use over a long term.

Also, the bellows 74 disposed between the first guard 43 and the top plate 7a contracts and extends in the vertical direction Z when the first guard 43 is elevated and lowered. The IPA nozzle moving unit 14 can thus be isolated from the ambient atmosphere regardless of the position of the first guard 43 in the vertical direction Z.

Also, the IPA nozzle 13 is housed in the housing space B. The second guard 44 can thus be disposed close to the first guard 43. The space A formed by the first guard 43 can thus be made small in an arrangement where the space A is defined from below by the second guard 44.

Also, the second extension portion 44B of the second guard 44 extends incliningly with respect to the horizontal direction H. The second extension portion 44B faces the flat portion 43D, which extends from the first cylindrical portion 43A of the first guard 43 and is flat in the horizontal direction H, from below. Therefore, even if the first guard 43 and the second guard 44 are positioned so that the second extension portion 44B is brought close to the flat portion 43D, the housing space B of sufficient size for housing the IPA nozzle 13 can be secured.

Also, with the present preferred embodiment, the replacing of the atmosphere inside the space A by the inert gas is started from the DIW rinse processing (S3). The replacing of the atmosphere inside the space A by the inert gas can thus be completed in a short time in comparison to a case where the replacing of the atmosphere inside the space A by the inert gas is started from the organic solvent processing (S4).

A processing unit 2 of the substrate processing apparatus 1 according to a first modification example of the present preferred embodiment shall now be described. FIG. 10A is an enlarged schematic sectional view of a vicinity of the IPA nozzle 13 according to the first modification example. FIG. 10B is a schematic sectional view taken along line XB-XB in FIG. 10A. Unlike in FIG. 10A, a range in the radial direction of the substrate W from the first cylindrical portion 43A of the first guard 43 to a vicinity of the rotational axis C1 of the substrate W is illustrated in FIG. 10B for convenience of description. In FIG. 10A and FIG. 10B and in FIG. 11 to FIG. 14 described below, members that are the same as the members that have been described already are provided with the same reference symbols and description thereof shall be omitted.

The processing unit 2 of the first modification example further includes a liquid eliminating unit 120 that is provided in the housing space B and eliminates a liquid attached to a surface of the IPA nozzle 13.

The liquid eliminating unit 120 includes an elastic contacting member 121, which comes in elastic contact with the IPA nozzle 13 to eliminate a liquid (liquid droplet) 127 of the processing liquid attached to the surface of the IPA nozzle 13, and a mounting member 122, arranged to mount the elastic contacting member 121 to the first cylindrical portion 43A of the first guard 43.

The IPA nozzle 13 comes in contact with the elastic contacting member 121 at a contacting position between the central position and the retracted position. The contacting position is a position that is slightly further to the radially inner side than the retracted position. In FIG. 10A, the IPA nozzle 13 at the retracted position is illustrated with alternate long and two short dashes lines. In FIG. 10A and FIG. 10B, the IPA nozzle 13 at the contacting position is illustrated with solid lines. Also, in FIGS. 10A and 10B, the IPA nozzle 13 positioned at a position further to the radially inner side than the contacting position is illustrated with alternate long and two short dashes lines.

The elastic contacting member 121 extends curvingly in the rotation direction of the substrate W. In detail, the elastic contacting member 121 has a curved shape matching the curved shape of the IPA nozzle 13.

The elastic contacting member 121 is capable of coming in contact with at least a portion that faces the upper surface of the substrate W, of the IPA nozzle 13 that is positioned at the central position. The elastic contacting member 121 has, for example, a form of an elastic body of thin rubber, etc. In detail, in the present preferred embodiment, the elastic contacting member 121 is a band-shaped rubber piece and is a wiper member that slidingly contacts a lower surface of the IPA nozzle 13 to eliminate the liquid 127 attached to the IPA nozzle 13.

The mounting member 122 extends curvingly in the rotation direction of the substrate W. In plan view, the mounting member 122 is oriented along an inner surface of the first cylindrical portion 43A.

The mounting member 122 includes a fixed portion 122A, fixed to the first cylindrical portion 43A, and a fixing portion 122B, fixing the elastic contacting member 121. The fixed portion 122A of the mounting member 122 is fixed to the first cylindrical portion 43A by a plurality of bolts 123 disposed at equal intervals in the rotation direction of the substrate W.

The fixing portion 122B projects to the radially inner side from an upper side portion of the fixed portion 122A. The elastic contacting member 121 is oriented along a lower surface of the fixing portion 122B. The elastic contacting member 121 is fixed to the fixing portion 122B by a plurality of bolts 124 disposed at equal intervals in the rotation direction of the substrate W. In this state, the elastic contacting member 121 is inclined with respect to the horizontal direction H so as to rise upward toward the radially inner side.

A first groove 125, by which the fixing portion 122B is recessed upward, is formed at a lower end of the fixing portion 122B. A second groove 126, by which a lower side portion of the fixed portion 122A is recessed toward the radially outer side, is formed at the lower side portion of the fixed portion 122A. The first groove 125 penetrates through the fixing portion 1223 toward the radially inner side. The second groove 126 penetrates downward through the fixed portion 122A. A radially outer side end of the first groove 125 and an upper end of the second groove 126 are in communication.

The first groove 125 and the second groove 126 are formed positions avoiding the bolts 123 and 124 in the rotation direction of the substrate W. A plurality of sets of the first groove 125 and the second groove 126 may be provided along the rotation direction of the substrate W. The liquid 127 that has been eliminated from the surface of the IPA nozzle 13 by the elastic contacting member 121 is expelled to below the mounting member 122 through the first groove 125 and the second groove 126 (see thick line arrows in FIG. 10A).

When the IPA nozzle 13 moves between the upper surface of the substrate W and the facing surface 6a of the shielding plate 6, the IPA supplied to the upper surface of the substrate W from the IPA nozzle 13 may splash back from the upper surface of the substrate W and the IPA may become attached to the surface of the IPA nozzle 13. Also, even when the IPA nozzle 13 is at the retracted position, chemical liquid, DIW, or IPA, etc., splashing from the upper surface of the substrate W may become attached to the surface of the IPA nozzle 13. Especially, when the chemical liquid, DIW, or IPA, etc., splashing from the upper surface of the substrate W is received by the first cylindrical portion 43A of the first guard 43, the chemical liquid, DIW, or IPA, etc., splashing from the upper surface of the substrate W becomes readily attached to the surface of the IPA nozzle 13.

With the arrangement of the first modification example, the liquid eliminating unit 120 can eliminate the liquid 127 attached to the surface of the IPA nozzle 13. Contamination of the substrate W due to dropping of the liquid 127, attached to the surface of the IPA nozzle 13, onto the upper surface of the substrate W can thus be prevented.

Also, the liquid eliminating unit 120 is provided in the housing space B, in which the IPA nozzle 13, positioned at the retracted position, is housed. The liquid 127 attached to the surface of the IPA nozzle 13 can thus be eliminated immediately before the IPA nozzle 13 moves from the retracted position to a position of facing the upper surface of the substrate W. Contamination of the substrate W due to dropping of the liquid 127, attached to the surface of the IPA nozzle 13, onto the upper surface of the substrate W can thus be prevented further.

Figure 11:
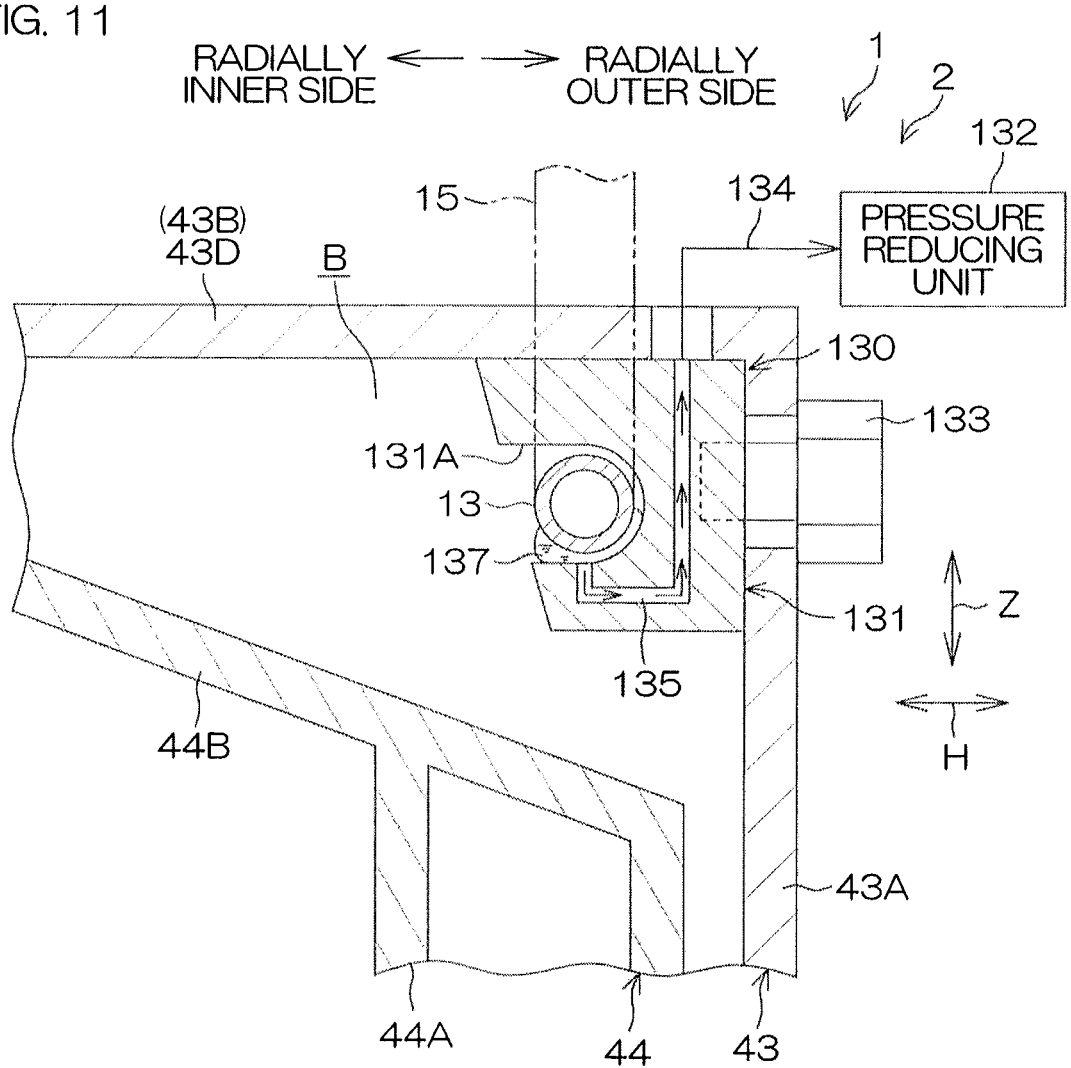
FIG. 11 is an enlarged schematic sectional view of a vicinity of a processing liquid supplying nozzle according to a second modification example of the present preferred embodiment.

A processing unit 2 of the substrate processing apparatus 1 according to a second modification example of the present preferred embodiment shall now be described. FIG. 11 is an enlarged schematic sectional view of a vicinity of the IPA nozzle 13 according to the second modification example of the present preferred embodiment.

The processing unit 2 according to the second modification example further includes a liquid eliminating unit 130 that eliminates a liquid (liquid droplet) 137 attached to the surface of the IPA nozzle 13.

The liquid eliminating unit 130 includes a housing member 131 that has a housing recess 131A that houses the IPA nozzle 13 positioned at the retracted position, and a pressure reducing unit 132 that reduces the pressure inside the housing recess 131A to suction the liquid inside the housing recess 131A. The liquid eliminating unit 130 is also a sucker that suctions the liquid inside the housing recess 131A.

The housing member 131, for example, extends curvingly in the rotation direction of the substrate W. In detail, the housing member 131 has a curved shape matching the curved shape of the IPA nozzle 13. In plan view, the housing member 131 is oriented along the inner surface of the first cylindrical portion 43A. The housing member 131 is fixed to the first cylindrical portion 43A by a plurality of bolts 133 disposed at equal intervals in the rotation direction of the substrate W.

The housing recess 131A is formed by a surface of the housing member 131 at the radially inner side being recessed toward the radially outer side. The housing recess 131A extends along the rotation direction of the substrate W. The housing recess 131A is capable of housing at least a portion of the IPA nozzle 13, positioned at the central position, that can face the upper surface of the substrate W.

The pressure reducing unit 132 has, for example, a form of a vacuum pump. The pressure reducing unit 132 is disposed at an exterior of the space A and the housing space B. The pressure reducing unit 132 is disposed higher than the first extension portion 43B of the first guard 43 or further to the radially outer side than the first cylindrical portion 43A of the first guard 43.

In the housing member 131 a waste liquid flow passage 135 that is connected to a piping 134 extending from the pressure reducing unit 132 and is in communication with the housing recess 131A, is formed. By the controller 3 controlling the pressure reducing unit 132 (see alternate long and two short dashes lines in FIG. 7), the liquid 137 inside the housing recess 131A is removed to the exterior of the housing recess 131A via the waste liquid flow passage 135 and the piping 134.

With the arrangement of the second modification example, the liquid eliminating unit 130 can eliminate the liquid 137 attached to the surface of the IPA nozzle 13. Contamination of the substrate W due to dropping of the liquid 137, attached to the surface of the IPA nozzle 13, onto the upper surface of the substrate W can thus be prevented.

Also, the housing member 131 of the liquid eliminating unit 130 is provided in the housing space B, in which the IPA nozzle 13, positioned at the retracted position, is housed. The liquid 137 attached to the surface of the IPA nozzle 13 can thus be eliminated immediately before the IPA nozzle 13 moves from the retracted position to a position of facing the upper surface of the substrate W. Contamination of the substrate W due to dropping of the liquid 137, attached to the surface of the IPA nozzle 13, onto the upper surface of the substrate W can thus be prevented further.

Also, by the pressure inside the housing recess 131A being reduced by the pressure reducing unit 132 in a state where the IPA nozzle 13, with the liquid 137 attached to the surface, is disposed in the housing recess 131A, the liquid 137 attached to the surface of the IPA nozzle 13 is eliminated reliably.

Figure 12A:
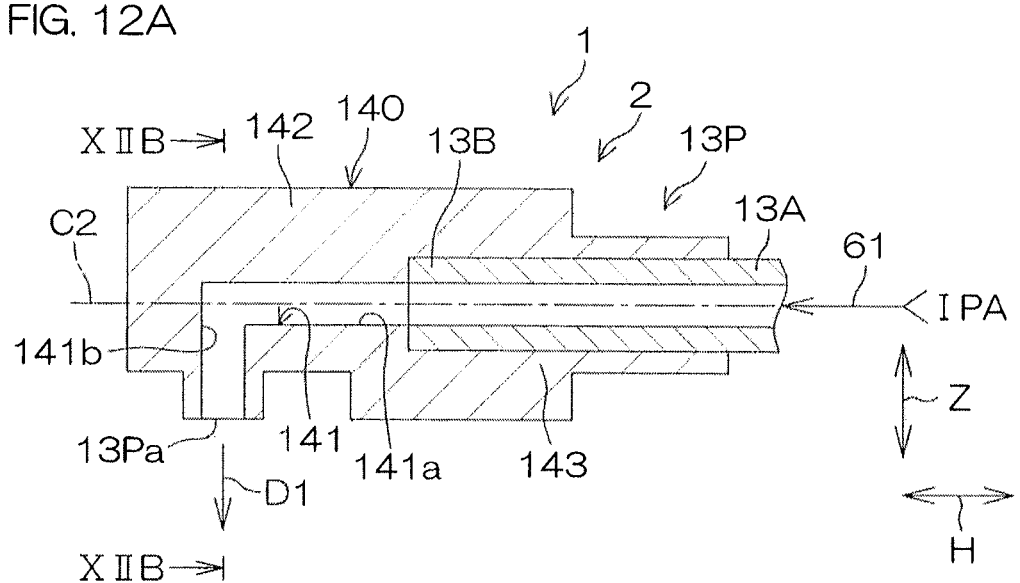
FIG. 12A is a schematic sectional view of a processing liquid supplying nozzle according to a third modification example of the present preferred embodiment.
Figure 12B:
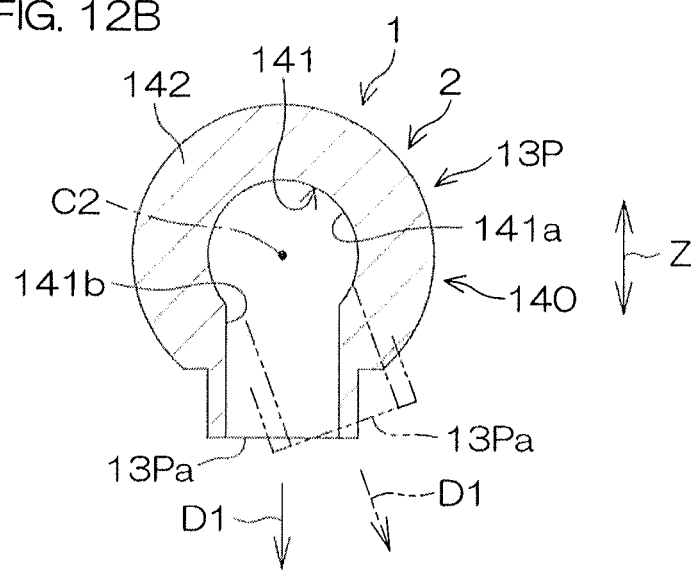
FIG. 12B is a schematic sectional view taken along line XIIB-XIIB in FIG. 12A.

A processing unit 2 of the substrate processing apparatus 1 according to a third modification example of the present preferred embodiment shall now be described. FIG. 12A is a schematic sectional view of an IPA nozzle 13P according to the third modification example. FIG. 12B is a schematic sectional view taken along line XIIB-XIIB in FIG. 12A.

Main points by which the IPA nozzle 13P according to the third modification example differs from the IPA nozzle 13 (see FIG. 3) of the present preferred embodiment are that the IPA nozzle 13P includes a discharge direction adjusting member 140 that adjusts a discharge direction D1 of the IPA discharged from a discharge port 13Pa and the discharge port 13Pa is provided at the discharge direction adjusting member 140.

The IPA nozzle 13P includes a circular cylindrical portion 13A, having a nozzle axis C2 extending in the horizontal direction H, and the discharge direction adjusting member 140, mounted to a tip portion 13B of the circular cylindrical portion 13A. The IPA supply pipe 61 is inserted in an internal space of the circular cylindrical portion 13A. IPA is supplied to the circular cylindrical portion 13A from the IPA supply pipe 61.

The discharge direction adjusting member 140 integrally includes the discharge port 13Pa, having a form of an orthogonal direction discharge port that discharges IPA in a direction orthogonal to the horizontal direction H, a flow passage forming portion 142, in which a flow passage 141 that guides the IPA to the discharge port 13Pa is formed, and a circumferential direction position adjusting portion 143, fitted to the tip portion 13B and capable of adjusting a position of the discharge port 13Pa in a circumferential direction of the circular cylindrical portion 13A.

Although in the third modification example, the circumferential direction position adjusting portion 143 is fitted externally to the tip portion 13B, it may, unlike in the third modification example, be fitted internally to the tip portion 13B.

The flow passage 141 includes a first flow passage 141a, extending in the horizontal direction H from the tip portion 13B of the circular cylindrical portion 13A, and a second flow passage 141b, extending toward the discharge port 13Pa from a tip of the first flow passage 141a.

The second flow passage 141b is an orthogonal flow passage extending in the direction orthogonal to the horizontal direction H. In a state where the discharge port 13Pa is directed downward, the discharge direction D1 of the IPA is downward. The discharge direction D1 can be adjusted in a circumferential direction of the circular cylindrical portion 13A by fitting the circumferential direction position adjusting portion 143 to the tip portion 13B of the circular cylindrical portion 13A in a state where the position of the discharge port 13Pa is adjusted in the circumferential direction of the circular cylindrical portion 13A (see alternate long and two short lines in FIG. 12B).

Figure 13:
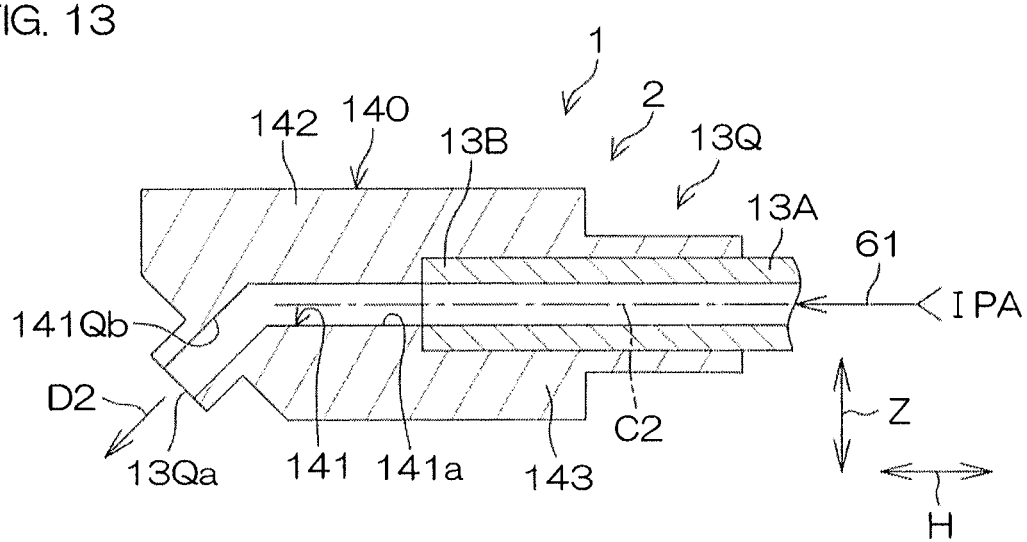
FIG. 13 is a schematic sectional view of a processing liquid supplying nozzle according to a fourth modification example of the present preferred embodiment.

A processing unit 2 of the substrate processing apparatus 1 according to a fourth modification example of the present preferred embodiment shall now be described. FIG. 13 is a schematic sectional view of an IPA nozzle 13Q according to the fourth modification example of the present preferred embodiment.

A main point by which the IPA nozzle 13Q according to the fourth modification example differs from the IPA nozzle 13P (see FIG. 12A) of the third modification example is that a discharge port 13Qa of the discharge direction adjusting member 140 is capable of discharging the IPA in a direction (discharge direction D2) that is a direction other than the direction orthogonal to the horizontal direction H and is inclined with respect to the horizontal direction H. The discharge direction D2 is a direction that is inclined with respect to both the horizontal direction H and the vertical direction so as to separate from the tip of the first flow passage 141a toward a tip of the IPA nozzle 13P in the horizontal direction H. A second flow passage 141Qb is an inclined flow passage extending in the discharge direction D2.

Figure 14:
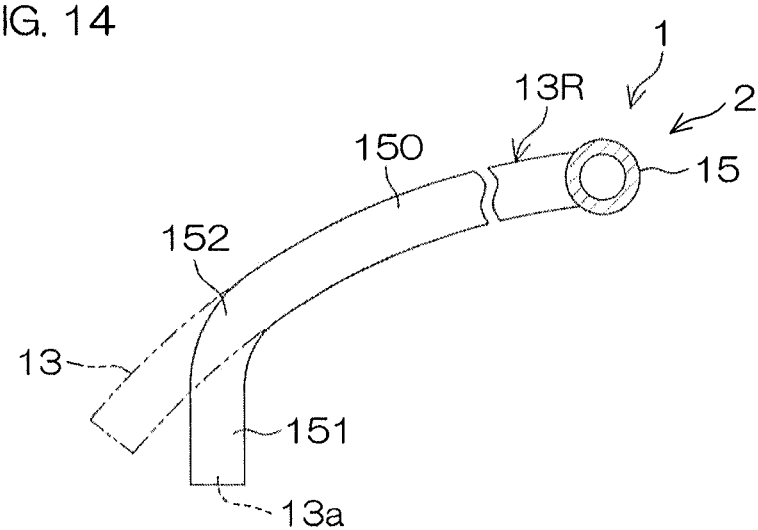
FIG. 14 is a plan view of a vicinity of a processing liquid supplying nozzle according to a fifth modification example of the present preferred embodiment.

A processing unit 2 of the substrate processing apparatus 1 according to a fifth modification example of the present preferred embodiment shall now be described. FIG. 14 is a plan view of a vicinity of an IPA nozzle 13R according to a fifth modification example of the present preferred embodiment.

A main point by which the IPA nozzle 13R according to the fifth modification example differs from the IPA nozzle 13 (see alternate long and two short dashes lines in FIG. 14) of the present preferred embodiment is that a tip of the IPA nozzle 13R is curved further than a portion besides the tip in plan view. In detail, the IPA nozzle 13R includes a first portion 150, connected to the nozzle supporting member 15 and extending in the horizontal direction H, and a second portion 151, connected to a tip of the first portion 150, and, in plan view, extending in the horizontal direction H and intersecting the direction in which the first portion 150 extends. The discharge port 13a, discharging the IPA downward toward the substrate W, is provided at a tip of the second portion 151. A connection portion 152 of the first portion 150 and the second portion 151 is disposed further to the tip side of the IPA nozzle 13R than a central portion in a length direction of the IPA nozzle 13R.

With the present modification example, the IPA nozzle 13R, in being moved around a rotational axis of the nozzle supporting member 15, can be moved with the second portion 151, at which the discharge port 13a is provided, being oriented along the radial direction of the substrate W.

The present invention is not restricted to the preferred embodiment described above and may be implemented in yet other modes.

For example, although with the present preferred embodiment, the IPA nozzle 13 is of an arrangement that moves around the rotational axis of the nozzle supporting member 15, the IPA nozzle 13 may, unlike in the present preferred embodiment, be of an arrangement that moves rectilinearly in the direction in which it extends.

Also, although with the present preferred embodiment, the chemical liquid nozzle 9 is a moving nozzle that moves in the horizontal direction H, it may, unlike in the present preferred embodiment, be a fixed nozzle disposed to discharge the chemical liquid to the rotation center of the upper surface of the substrate W. In detail, the chemical liquid nozzle 9 may have a form of being inserted, together with the DIW nozzle 10, the inert gas nozzle 12, and the central IPA nozzle 11, through the nozzle housing member 35 that is inserted through the hollow shaft 30.

Also, in the DIW rinse processing, instead of positioning the shielding plate 6 at the second proximity position (see FIG. 9C), the shielding plate 6 may be positioned at the first proximity position.

In the present state, the controller 3 may control the first guard elevating/lowering unit 46 and the second guard elevating/lowering unit 47 to position the second guard 44 at the shielding plate facing position or higher than the shielding plate facing position while making the first guard 43 and the second guard 44 approach each other in the vertical direction Z. The housing space B is thereby defined and the IPA nozzle 13 is positioned inside the housing space B.

Further, in the present state, the controller 3 may control the third guard elevating/lowering unit 48 to position the third guard 45 higher than the substrate W. The chemical liquid and DIW that splashed outside the substrate due to the centrifugal force pass below the third extension portion 45B of the third guard 45 and are received by the third cylindrical portion 45A of the third guard 45. The IPA nozzle 13 is housed in the housing space B and therefore contamination of the IPA nozzle 13 due to the chemical liquid and DIW splashed from the upper surface of the substrate W is suppressed or prevented. In this case, the space A is formed in the IPA replacing step of the organic solvent processing and the replacing of the atmosphere inside the space A by the inert gas is performed in the IPA replacing step.

Also, each processing unit 2 may include a heater that heats the substrate W in the organic solvent processing. The heater may be incorporated in the spin base 21 or may be incorporated in the shielding plate 6 or may be incorporated in both the spin base 21 and the shielding plate 6. If the substrate W is to be heated in the organic solvent processing, at least one among the lower surface nozzle 8, the heater incorporated in the spin base 21, and the heater incorporated in the shielding plate 6 is used.

Also, in the organic solvent processing, the shielding plate 6 does not necessarily have to rotate synchronously with the spin base 21, and the rotational speed of the shielding plate 6 and the rotational speed of the spin base 21 may differ.

Also, the arrangement of the processing liquid supplying nozzle is not restricted, for example, to the IPA nozzle 13 that supplies the IPA or other organic solvent to the upper surface of the substrate W and suffices to be an arrangement that supplies a processing liquid to the upper surface of the substrate W. That is, the processing liquid supplying nozzle may be a low surface tension liquid nozzle, supplying a low surface tension liquid of surface tension lower than water to the upper surface of the substrate W or may be a chemical liquid nozzle, supplying a chemical liquid to the upper surface of the substrate W, or may be a rinse liquid nozzle, supplying DIW or other rinse liquid to the upper surface of the substrate W.

Also, the discharge direction adjusting member 140 may include a discharge port discharging the IPA in a direction other than the discharge port 13Pa of the third modification example and the discharge port 13Qa of the fourth modification example. That is, the discharge direction adjusting member 140 may include a discharge port that discharges the IPA in a direction differing from the IPA nozzle horizontal direction H (direction not parallel to the nozzle axis C2).

The present application corresponds to Japanese Patent Application No. 2016-069652 filed in the Japan Patent Office on Mar. 30, 2016, and the entire disclosure of the application is incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus that processes a substrate by a processing liquid, the substrate processing apparatus comprising:
a substrate holder that holds a substrate horizontally;
a facing member, having a facing surface that faces an upper surface of the substrate held by the substrate holder;
a guard that is disposed so as to surround the substrate holder and the facing member in plan view, being capable of defining, together with the substrate held by the substrate holder and the facing member, a space isolated from an ambient atmosphere, and receives the processing liquid removed off the substrate;
a processing liquid supplying nozzle that extends from an inner wall of the guard so as to be disposed inside the space in a state where the space is defined, and supplies the processing liquid to the upper surface of the substrate held by the substrate holder;
an inert gas nozzle that supplies an inert gas to the space to replace an atmosphere inside the space by the inert gas;
a lower side guard that is disposed so as to surround the substrate holder and the facing member in plan view, defines the space from below the guard, and receives the processing liquid removed off the substrate;
a guard lifter which elevates and lowers the guard; and
a lower side guard lifter which elevates and lowers the lower side guard independently from the guard,
wherein an inner side end of the guard in a radial direction of the substrate held by the substrate holder and an inner side end of the lower side guard in the radial direction are positioned radially outward from an outer side end of the facing member in the radial direction,
the guard and the lower side guard are brought towards each other in a vertical direction such that the inner side end of the guard and the inner side end of the lower side guard are located above the upper surface of the substrate, in a state where the processing liquid supplying nozzle is housed in a housing space which is between the guard and the lower side guard,
the apparatus further comprises a second processing liquid supplying nozzle which moves between a retracted position and a processing position, and supplies a second processing liquid to the substrate when the second processing liquid supplying nozzle is positioned at the processing position,
the retracted position is a position where the second processing liquid supplying nozzle is retracted from a gap between the substrate held by the substrate holder and the facing member,
the processing position is a position where the second processing liquid supplying position is positioned in the gap between the substrate held by the substrate holder and the facing member,
the second processing liquid supplying nozzle moves, through a vertical gap between the guard and the facing member, to go between the retracted position and the processing position,
wherein the apparatus further comprises:
a pivoting shaft that supports the processing liquid supplying nozzle and moves the processing liquid supplying nozzle between the substrate held by the substrate holder and the facing member, and a driving motor that is fixed to the guard and drives the pivoting shaft,
a bracket that is mounted to the guard lifter and fixes the driving motor to the guard,
wherein a portion of the driving motor that is fixed by the bracket overlaps with the guard lifter in plan view, and
a fixed member that is disposed above the guard and is fixed in position in a vertical direction with respect to the substrate holder, and a bellows that is disposed between the guard and the fixed member, isolates the driving motor from the ambient atmosphere, and is extensible and contractible vertically.

2. The substrate processing apparatus according to claim 1, wherein the pivoting shaft is inserted through a penetrating hole formed in the guard, and the driving motor is disposed outside the space in the state where the space is defined.

3. The substrate processing apparatus according to claim 1, wherein the guard includes a cylindrical portion that surrounds the substrate holder, and a flat portion that extends from the cylindrical portion and is flat in a horizontal direction,
the lower side guard includes a facing portion that extends incliningly with respect to the horizontal direction and faces the flat portion from below, and
the housing space is defined by the cylindrical portion, the flat portion, and the facing portion.

4. The substrate processing apparatus according to claim 1, further comprising: a base which is supported by the bracket and on which the driving motor is placed and fixed; and
a second bracket which is connected to the guard and supports the base.

5. The substrate processing apparatus according to claim 1, further comprising: a cover which houses a lower end of the driving motor, and is fixed to the guard from above,
wherein the bellows extends between the cover and the fixed member so as to surround the driving motor which partially protrudes upward from the cover.

6. The substrate processing apparatus according to claim 1, wherein the guard includes a cylinder portion which surrounds the substrate holder, and an extension portion which extends from the cylinder portion toward the substrate holder,
the extension portion includes an inclined portion which is inclined with respect to a horizontal direction so as to head upward toward the substrate holder, and a flat portion which is adjacent to the inclined portion from a circumferential direction of the cylinder portion and extends in the horizontal direction so as to be located higher than the inclined portion,
the lower side guard includes a facing portion which extends incliningly with respect to the horizontal direction and faces the extension portion from below, and
the housing space is defined by the cylinder portion, the flat portion and the facing portion.

7. The substrate processing apparatus according to claim 1, further comprising:
a liquid eliminating unit that eliminates a liquid attached to a surface of the processing liquid supplying nozzle,
wherein the liquid eliminating unit includes an elastic contacting member which comes in elastic contact with the processing liquid supplying nozzle to eliminate the liquid attached to the surface of the processing liquid supplying nozzle.

8. The substrate processing apparatus according to claim 1, further comprising:
a liquid eliminating unit that eliminates a liquid attached to a surface of the processing liquid supplying nozzle,
wherein the liquid eliminating unit includes a housing member which has a housing recess for housing the processing liquid supplying nozzle, and a pump which suctions inside the housing recess.

9. The substrate processing apparatus according to claim 1, wherein the processing liquid supplying nozzle includes:
a circular cylindrical portion which has a nozzle axis extending in a horizontal direction; and
a discharge direction adjusting member which has a discharge port discharging the processing liquid in a direction orthogonal to the horizontal direction, wherein the discharge direction adjusting member is attached to a tip end portion of the circular cylindrical portion so as to adjust a position of the discharge port with respect to the circular cylindrical portion in a circumferential direction of the circular cylindrical portion.

10. The substrate processing apparatus according to claim 1, wherein the processing liquid supplying nozzle includes:
a circular cylindrical portion which has a nozzle axis extending in a horizontal direction; and
a discharge direction adjusting member which has a discharge port discharging the processing liquid in a direction other than orthogonal to the horizontal direction and inclined with respect to the horizontal direction, wherein the discharge direction adjusting member is attached to a tip end portion of the circular cylindrical portion so as to adjust a position of the discharge port with respect to the circular cylindrical portion in a circumferential direction of the circular cylindrical portion.

11. The substrate processing apparatus according to claim 1, wherein a tip end of the processing liquid supplying nozzle is, in plan view, more curved than a part of the processing liquid supplying nozzle other than the tip end.

* * * * *